(12) United States Patent
Ogura

(10) Patent No.: US 10,804,852 B2
(45) Date of Patent: Oct. 13, 2020

(54) HIGH-VOLTAGE OUTPUT AMPLIFIER

(71) Applicant: Masaki Ogura, Yamato-shi, Kanagawa (JP)

(72) Inventor: Shizuo Ogura, Yokohama (JP)

(73) Assignee: Masaki Ogure, Yamato-shi, Kanagawa (JP)

( * ) Notice: Subject to any disclaimer, the term of this patent is extended or adjusted under 35 U.S.C. 154(b) by 25 days.

(21) Appl. No.: 16/261,930

(22) Filed: Jan. 30, 2019

(65) Prior Publication Data

US 2019/0393839 A1 Dec. 26, 2019

(30) Foreign Application Priority Data

Jun. 20, 2018 (JP) ................................ 2018-117264

(51) Int. Cl.
*H03F 3/08* (2006.01)
*H03F 1/02* (2006.01)
*H03F 3/16* (2006.01)

(52) U.S. Cl.
CPC ............. *H03F 1/0205* (2013.01); *H03F 3/16* (2013.01); *H03F 2200/198* (2013.01)

(58) Field of Classification Search
CPC ........................................................ H03F 3/08
USPC ................................................. 330/308, 311
See application file for complete search history.

(56) References Cited

U.S. PATENT DOCUMENTS

| | | | | |
|---|---|---|---|---|
| 6,297,600 B1* | 10/2001 | George | ..................... | H04N 3/26 315/382 |
| 6,307,660 B1* | 10/2001 | Cordell | .............. | H04B 10/6911 398/209 |
| 7,454,190 B2* | 11/2008 | Schrodinger | ........ | H04B 10/693 330/98 |
| 2007/0228257 A1* | 10/2007 | Soltesz | ................... | H03F 3/343 250/214 A |

FOREIGN PATENT DOCUMENTS

JP          2016-532339 A     10/2016
WO         2015/047524 A1     4/2015

* cited by examiner

*Primary Examiner* — Henry Choe
(74) *Attorney, Agent, or Firm* — Westerman, Hattori, Daniels & Adrian, LLP

(57) ABSTRACT

To provide a high-voltage output amplifier having a wide bandwidth which can efficiently reduce power consumption and allows employment of relatively low withstand voltage Nch MOS FETs without imbalanced voltage distribution between a Nch MOS FET Q101 and a Nch MOS FET Q102 and imbalanced distribution between a Nch MOS FET Q201 and a Nch MOS FET Q202.

A high-voltage amplifier of a positive-side output stage circuit comprises a Nch MOS FET Q101 and a Nch MOS FET Q102, while a high-voltage amplifier of a negative-side output stage circuit comprises a Nch MOS FET Q201 and a Nch MOS FET Q 202. The source of the Nch MOS FET Q101 is connected to the drain of the Nch MOS FET Q102, the source of the Nch MOS FET Q201 is connected to the drain of the Nch MOS FET Q202. Current controls at the source of the Nch MOS FET Q102 and the source of the Nch MOS FET Q202 are conducted respectively. The current control at the source of the Nch MOS FET Q202 is conducted by a negative-side photo coupler. The gate of the Nch MOS FET Q101 and the gate of the Nch MOS FET Q201 are connected via a condenser C151.

6 Claims, 18 Drawing Sheets

HIGH-VOLTAGE OUTPUT AMPLIFIER

FIELD OF THE INVENTION

The present invention relates to a high-voltage output amplifier using negative channel metal oxide semiconductor field-effect transistors (hereinafter, referred to as "Nch MOS FETs") in its output stage, particularly to a high-voltage output amplifier of which a high-voltage circuit of an output stage is composed of Nch MOS FETs because there are no high withstand voltage products of positive channel metal oxide semiconductor field-effect transistors.

DESCRIPTION OF RELATED ART

FIG. 1 is a drawing showing a circuit configuration example of a conventional high-voltage output amplifier, of this kind, of a shunt positive voltage output type. The output stage of the high-voltage output amplifier comprises a pair of Nch MOS FETs Q101 and Q102 of which a source and a drain are connected in an upper part of FIG. 1 (hereinafter, sometimes referred to as "upper Nch MOS FETs Q101 and Q102") and a pair of Nch MOS FETs Q201 and Q202 of which a source and a drain are connected in a lower part of FIG. 1 (hereinafter, sometimes referred to as "lower Nch MOS FETs Q201 and Q202"). Between the source of the upper Nch MOS FET Q102 and the drain of the lower Nch MOS FET Q201, a resistor R103, a simulation resistor R105, and a simulation resistor R205 are connected in series.

The drain of the upper Nch MOS FET Q101 is connected to a high-voltage positive power source +HVps through a simulation resistor R104. Between the drain and gate of the Nch MOS FET Q101, a resistor R101 is connected. Between the gate of the Nch MOS FET Q101 and the gate of the Nch MOS FET Q102, a resistor R102 is connected. Between the gate of the Nch MOS FET Q102 and an end, opposite to the Nch MOS FET Q102, of the resistor R103, a parallel circuit of a Zener diode D102 and a condenser C101 is connected in parallel.

In addition, a resistor R201 is arranged between the drain and gate of the Nch MOS FET Q201, and a resistor 8202 is arranged between the gate of the Nch MOS FET Q201 and an end of a resistor R203, of which the other end is connected to the source of the Nch MOS FET Q202, such that the resistor R202 is connected in parallel to the resistor R203. A low-voltage negative power source −V is connected to a joint between the resistor R202 and the resistor R203 through a simulation resistor 8204. An output line $1_{out}$ is connected to a joint between the simulation resistor R105 and the simulation resistor R205 and it functions as an output part of the high-voltage output amplifier.

An input part of the high-voltage output amplifier has an operational amplifier U1 of which output signal, as well as being fed back to an input terminal of the operational amplifier U1 through a series circuit including a resistor R9 and a condenser C1, is introduced into a gate of the Nch MOS FET Q202 in the lower part of the output stage through a resistor R5. Further, an output signal from the output part of the high-voltage output amplifier is fed back to the input terminal of the operational amplifier U1 through a circuit composed of a parallel circuit of a resistor R2 with a condenser C2, a parallel circuit of a resistor R3 with a condenser C3, and a parallel circuit of a resistor R4 with a condenser C4 in which these parallel circuits are connected in series.

CITATION LIST

Patent Literature

Patent Literature 1: Japanese Translation of PCT International Publication No. 2016-532339

SUMMARY OF INVENTION

Problems to be Solved by the Invention

In the high-voltage output amplifier of a shunt positive voltage output type having the aforementioned configuration shown in FIG. 1, the Nch MOS FET Q101 and the Nch MOS FET Q102 in the upper part of the output stage compose a constant-current source circuit (source constant-current circuit) of which current can be supplied as the maximum output current to a load L comprising a resistor R501 and a condenser C501. In the high-voltage output amplifier, the upper Nch MOS FET Q101 and the upper Nch MOS FET Q102 are not subjected to source current control so that the efficiency must decrease. It is possible to control the upper Nch MOS FET Q101 and the upper Nch MOS FET Q102 by the operational amplifier U1. But this case needs an expensive DC/DC power source having high withstand voltage (6100V or more in FIG. 1) for gate control of the Nch MOS FET Q102.

The gate of the Nch MOS FET Q202 is controlled by the operational amplifier U1 in such a manner that current after taking the output current from the source constant-current circuit, in which the source of the lower Nch MOS FET Q201 and the drain of the lower Nch MOS FET Q202 are connected, is sucked to get the output voltage $V_{OUT}$ proportional to the input voltage Vin (in FIG. 1, assuming, for example, the resistance of R1 is 5 kΩ and resistances of R2, R3, R4 are 10001a respectively, the amplification factor G of the operational amplifier U1={1+(R2+R3+R4)/R1}=601 times). Therefore, in the high-voltage output amplifier as mentioned above, the high-voltage positive source +HVps (+6100V) always supplies the maximum power regardless of the output current and the output voltage.

At no load, the maximum power is consumed by the Nch MOS FET Q101, the Nch MOS FET Q102, the Nch MOS FET Q201 and the Nch MOS FET Q202. For example if the current supplied by the source constant-current circuit composed of the Nch MOS FET Q101 and the Nch MOS FET Q102 is 30 mA, power 30 mA×6100V=183 W should be consumed as heat in the source constant-current circuit. In many cases, accordingly, a circuit for making the source constant-current circuit active only when output is required is provided in order to reduce power consumption during non-operation.

Further, in the high-voltage output amplifier shown in FIG. 1, the higher the frequency of the input Vin, the easier the voltage distribution between the Nch MOS FET Q101 and the Nch MOS FET Q102 and the voltage distribution between the Nch MOS FET Q201 and the Nch MOS FET Q202 become imbalanced. Therefore, there is a problem that the Nch MOS FETs must have sufficient withstand voltage so that the Nch MOS FETs must be expensive.

Furthermore, since impedances at the gates of the Nch MOS FET Q101 and the Nch MOS FET Q201 are high, the Nch MOS FET Q101 and the Nch MOS FET Q201 operate with slow responses so that there is also a problem that the bandwidth of the high-voltage output amplifier becomes narrow.

The present invention has been made in consideration of the aforementioned points. It is an object of the present invention to remove the aforementioned problems and to provide a high-voltage output amplifier having a wide bandwidth which is efficient and allow employment of relatively low withstand voltage Nch MOS FETs without making the voltage distribution between the Nch MOS FET Q101 and the Nch MOS FET Q102 and the voltage distribution between the Nch MOS FET Q201 and the Nch MOS FET Q202 imbalanced without need of expensive DC/DC power source having high withstand voltage for gate control of Nch MOS FETs, and with relatively low power consumption.

Means for Solving the Problems

To solve the aforementioned problems, the present invention provides a high-voltage output amplifier comprising an input stage circuit having a low-voltage amplifier, output stage circuit(s) having high-voltage amplifier(s), and photo coupler(s) intervening between the input stage circuit and the output stage circuit(s), wherein an input signal is amplified by the low-voltage amplifier, the amplified signal is introduced into the high-voltage amplifier(s) through the photo coupler(s) and is amplified, and the signal thus amplified is outputted from an output terminal of the high-voltage output amplifier, and is characterized in that the high-voltage amplifier comprises at least one Nch MOS FET, and that a high voltage from a high-voltage power source is introduced into the drain of the Nch MOS FET while a bias voltage is applied to the gate so that the current control at the source of the Nch MOS FET is conducted by the photo coupler.

In the aforementioned high-voltage output amplifier, the present invention is further characterized in that the output stage circuit(s) include a positive-side output stage circuit and a negative-side output stage circuit, the photo coupler(s) include a positive-side photo coupler and a negative-side photo coupler, that the high-voltage amplifier of the positive-side output stage circuit introduces a positive high voltage from the high-voltage power source to the drain of the Nch MOS FET and applies a positive bias voltage of a predetermined value to the gate so that the current control at the source of the Nch MOS FET is conducted by the positive-side photo coupler, and the high-voltage amplifier of the negative-side output stage circuit introduces a negative high voltage from the high-voltage power source to the source of the Nch MOS FET and applies a negative bias voltage of a predetermined value to the gate so that the current control at the source of the Nch MOS FET is conducted by the negative-side photo coupler.

In the aforementioned high-voltage output amplifier, the present invention is further characterized in that, in each of the high-voltage amplifier of the positive-side output stage circuit and the high-voltage amplifier of the negative-side output stage circuit, the Nch MOS FET is referred to as a first Nch MOS FET, a second Nch MOS FET is further provided, and the drain of the second Nch MOS FET is connected to the source of the first Nch MOS FET, that a positive bias voltage of a predetermined value is applied to the gate of the positive-side second Nch MOS FET, and a negative bias voltage of a predetermined value is applied to the gate of the negative-side second Nch MOS FET, and that the current control at the source of the positive-side second Nch MOS FET is conducted by the positive-side photo coupler and the current control at the source of the negative-side second Nch MOS FET is conducted by the negative-side photo coupler.

In the aforementioned high-voltage output amplifier, the present invention is further characterized by having a means of making the Nch MOS FETs operate in pseudo grounded gate manner by decreasing the impedances at the gate of the first Nch MOS FET in the positive-side output stage circuit and at the gate of the first Nch MOS FET in the negative-side output stage circuit.

In the aforementioned high-voltage output amplifier, the present invention is further characterized in that, as the means of making the Nch MOS FETs operate in pseudo grounded gate manner, a series circuit consisting of a condenser having a predetermined capacitance value and a resistor having a predetermined resistance value is arranged between the gate of the first Nch MOS FET in the positive-side output stage circuit and the gate of the first Nch MOS FET in the negative-side output stage circuit.

In the aforementioned high-voltage output amplifier, the present invention is further characterized in that each photo coupler is composed of a plurality of photo couplers according to the amplitude of the output current value, output currents at light receiving sections of the photo couplers are merged with each other, and the current control at the source of the second Nch MOS FET is conducted by the merged current.

Further, the present invention provides a high-voltage output amplifier comprising an input stage circuit having a low-voltage amplifier, output stage circuits having high-voltage amplifiers, and photo couplers intervening between the input stage circuit and the output stage circuits, wherein an input signal is amplified by the low-voltage amplifier, the amplified signal is introduced into the high-voltage amplifiers through the photo couplers and is amplified, and the signal thus amplified is outputted from an output terminal of the high-voltage output amplifier, and is characterized in that the output stage circuits include a positive-side output stage circuit and a negative-side output stage circuit, and the photo couplers include a positive-side photo coupler and a negative-side photo coupler, that the high-voltage amplifier of each output stage circuit comprises Nch MOS FETs of N stages, and the source of the Nch MOS FET in one stage and the drain of the Nch MOS FET in the next stage are connected to each other in such a manner that the source of the Nch MOS FET in the first stage and the drain of the Nch MOS FET in the second stage are connected to each other, and that the source of the Nch MOS FET of the N-th stage of the high-voltage amplifier in the positive-side output stage circuit is connected to the drain of the Nch MOS FET of the first stage of the high-voltage amplifier in the negative-side output stage circuit through a resistor, that a voltage of a predetermined positive high voltage value from a high-voltage positive power source is introduced into the drain of the Nch MOS FET of the first stage of the high-voltage amplifier in the positive-side output stage circuit while a gate voltage of a predetermined positive voltage value is applied to the gate of the Nch MOS FETs in the respective stages, that a voltage of a predetermined negative high voltage value from a high-voltage negative power source is introduced into the source of the Nch MOS FET of the N-th stage of the high-voltage amplifier in the negative-side output stage circuit while a gate voltage of a predetermined negative voltage value is applied to the gate of the Nch MOS FETs in the respective stages, and that the current control at the source of the Nch MOS FET of the N-th stage in the positive output stage circuit is conducted by the positive-side photo coupler and the current control at the source of the Nch MOS FET of the N-th stage in the negative output stage circuit is conducted by the negative-side photo coupler.

In the aforementioned high-voltage output amplifier, the present invention is further characterized in that the gates of the respective Nch MOS FETs of the high-voltage amplifier in the positive-side output stage circuit are connected to the gates of the respective Nch MOS FETs of the high-voltage amplifier in the negative-side output stage circuit via condensers of predetermined capacitance value, respectively in such a manner that the gate of the Nch MOS FET of the first stage of the high-voltage amplifier in the positive-side output stage circuit is connected to the gate of the Nch MOS FET of the N−1-th stage of the high-voltage amplifier in the negative-side output stage circuit, the gate of the Nch MOS FET of the second stage of the high-voltage amplifier in the positive-side output stage circuit is connected to the gate of the Nch MOS FET of the N−2-th stage of the high-voltage amplifier in the negative-side output stage circuit . . . the gate of the Nch MOS FET of the N−1-th stage of the high-voltage amplifier in the positive-side output stage circuit is connected to the gate of the Nch MOS FET of the first stage of the high-voltage amplifier in the negative-side output stage circuit.

In the aforementioned high-voltage output amplifier, the present invention is further characterized in that a resistor is connected in series to each condenser connecting the gate of the Nch MOS FET of the high-voltage amplifier in the positive-side output stage circuit to the gate of the Nch MOS FET of the high-voltage amplifier in the negative-side output stage circuit.

Furthermore, the present invention provides a high-voltage output amplifier comprising an input stage circuit having a low-voltage amplifier, output stage circuits having high-voltage amplifiers, and photo couplers intervening between the input stage circuit and the output stage circuits, wherein an input signal is amplified by the low-voltage amplifier, the amplified signal is introduced into the high-voltage amplifiers through the photo couplers and is amplified, and the signal thus amplified is outputted from an output terminal of the high-voltage output amplifier, and is characterized in that the output stage circuit include one or more positive-side output stage circuits disposed in the positive side and one or more negative-side output stage circuits in the negative side, that each high-voltage amplifier in the positive-side output stage circuit and in the negative-side output stage circuit comprises at least first and second Nch MOS FETs, wherein the source of the first Nch MOS FET is connected to the drain of the second Nch MOS FET, the source of the second Nch MOS FET of the high-voltage amplifier in the positive-side output stage circuit is connected via a resistor to the drain of the first Nch MOS FET of the high-voltage amplifier in the negative-side output stage circuit, a voltage of a predetermined positive high voltage value from a high-voltage power source is introduced into the drain of the first Nch MOS FET of the high-voltage amplifier in the positive-side output stage circuit while a bias voltage of a predetermined positive voltage value is applied to the respective gates of the first Nch MOS FET and the second Nch MOS FET, and a voltage of a predetermined negative high voltage value from a high-voltage power source is introduced into the source of the second Nch MOS FET of the high-voltage amplifier in the negative-side output stage circuit while a bias voltage of a predetermined negative voltage value is applied to the respective gates of the first Nch MOS FET and the second Nch MOS FET, and that the current control at the source of the second Nch MOS FET of the high-voltage amplifier in the positive output stage circuit is conducted by the positive-side photo coupler, and the current control at the source of the second Nch MOS FET in the negative output stage circuit is conducted by the negative-side photo coupler.

In the aforementioned high-voltage output amplifier, the present invention is further characterized in that the gate of the first Nch MOS FET of the high-voltage amplifier in the positive-side output stage circuit and the gate of the first Nch MOS FET of the high-voltage amplifier in the negative-side output stage circuit are connected to each other through a condenser having at least a predetermined capacitance value.

In the aforementioned high-voltage output amplifier, the present invention is further characterized in that a resistor is connected in series to the condenser connected between the gate of the first Nch MOS FET in the positive-side output stage circuit and the gate of the first Nch MOS FET in the negative-side output stage circuit.

Effects of the Invention

According to the present invention, the current control at the source of the Nch MOS FET is conducted by a photo coupler, differently from conventional high-voltage output amplifier of this kind in which a gate is controlled. Therefore, the present invention can make an expensive and high withstand voltage DC/DC converter unnecessary and thus has the effect of simplifying the circuit configuration of the high-voltage output amplifier and even lowering the manufacturing cost.

According to the present invention, the output stage circuit comprises a positive-side output stage circuit and a negative-side output stage circuit while the photo coupler comprises a positive-side photo coupler and a negative-side photo coupler. In the high-voltage amplifier of the positive-side output stage circuit, the current control at the source of the Nch MOS FET is conducted by the positive-side photo coupler. In the high-voltage amplifier of the negative-side output stage circuit, the current control at the source of the Nch MOS FET is conducted by the negative-side photo coupler. Therefore, the present invention can provide a high-voltage output amplifier having a simple circuit configuration capable of outputting positive voltages, negative voltages, or both positive and negative voltages and capable of considerably reducing power consumption.

According to the present invention, in each high-voltage amplifier of the positive-side output stage circuit and the negative-side output stage circuit, the drain of the second Nch MOS FET is connected to the source of the first Nch MOS FET and the current control at the source of each second Nch MOS FET is conducted by the positive-side photo coupler or the negative-side photo coupler, that is, the photo coupler conducts the current control at the source of the Nch MOS FET of a low impedance. Therefore, the present invention can provide a high-voltage output amplifier which can go well together with photo couplers and has a wide bandwidth.

According to the present invention, the gate of the first Nch MOS FET in the positive-side output stage circuit and the gate of the first MOS FET in the negative-side output stage circuit are connected via a condenser of a predetermined capacitance value so that the positive-side and negative-side first Nch MOS FETs operate in pseudo grounded gate manner, thereby significantly improving the performance as described in detail later.

According to the present invention, the photo coupler is composed of a plurality of photo couplers according to the amplitude of the output current value, output currents at light receiving sections of the photo couplers are merged with each other, and the current control at the source of the second Nch MOS FET is conducted by the merged current. Therefore, the present invention can provide a high-voltage output amplifier capable of easily handling increase in the output current.

DETAILED DESCRIPTION

Figure 1:
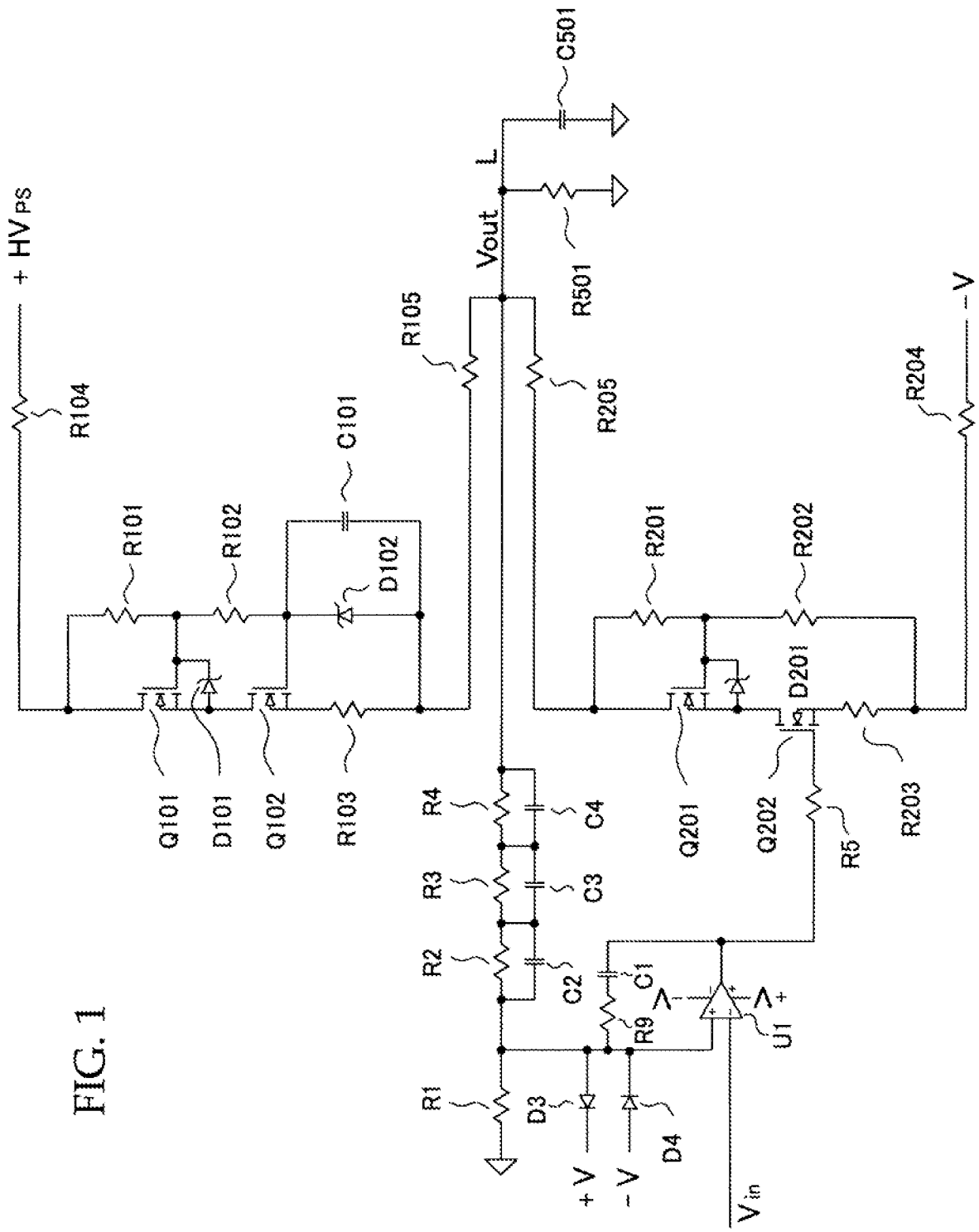
FIG. 1 is a drawing showing a circuit configuration of a conventional high-voltage output amplifier of a shunt positive voltage output type.
Figure 2:
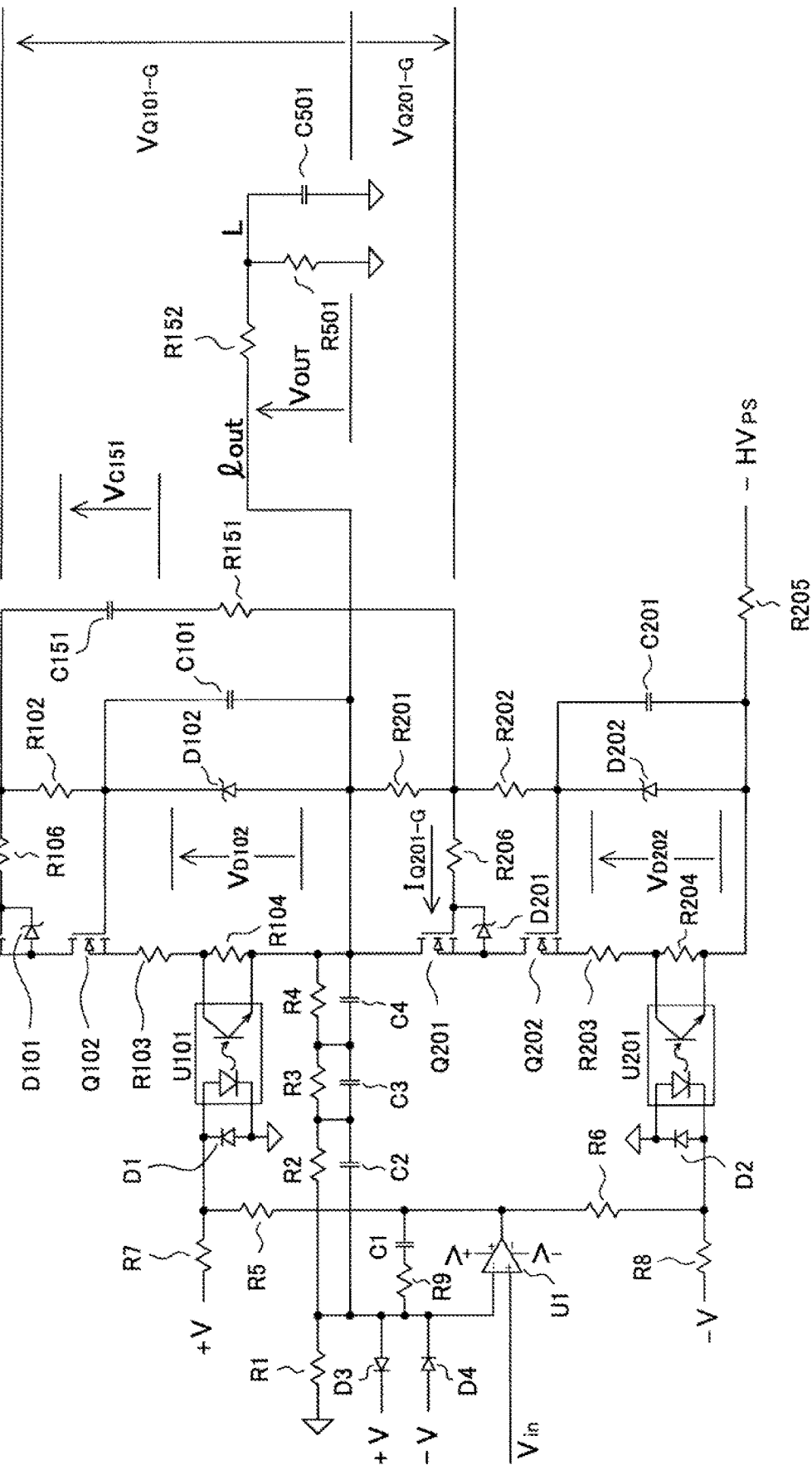
FIG. 2 is a drawing showing a circuit configuration example of a high-voltage output amplifier according to the present invention.

Hereinafter, embodiments of the present invention will be described. FIG. 2 is a drawing showing a circuit configuration of a high-voltage output amplifier according to the present invention. The high-voltage output amplifier comprises a pair of Nch MOS FETs Q101 and Q102 of which a source and a drain are connected in a positive side of an output stage (an upper part of FIG. 2) and a pair of Nch MOS FETs Q201 and Q202 of which a source and a drain are connected in a negative side of the output stage (a lower part of FIG. 2). That is, the output stage of the high-voltage output amplifier is composed only of Nch MOS FET semiconductor devices such that high-voltage positive output and high-voltage negative output can be implemented. Current controls at the sources (not gates) of the Nch MOS FET Q102 and the Nch MOS FET Q202 of the output stage are conducted by a photo coupler U101 and a photo coupler U201, respectively. In the figure, "+HVps" indicates a positive high-voltage power source (for example +3100V), "–HVps" indicates a negative high-voltage power source (for example –3100V), "+V" indicates a positive low-voltage power source (for example +15V), and "–V" indicates a negative low-voltage power source (for example –15V).

The drain of the Nch MOS FET Q101 in the positive side of the output stage is connected to the positive high-voltage power source +HVps via a simulation resistor R105 (for example 1Ω) and the source of the Nch MOS FET Q101 is connected to the drain of the Nch MOS FET Q102. Between the source and gate of the Nch MOS FET Q101, a Zener diode D101 is bridged (cathode of the Zener diode D101 is connected to the gate of the Nch MOS FET Q101, anode of the Zener diode D101 is connected to the source of the Nch MOS FET Q101). The source of the Nch MOS FET Q102 is connected to one end of a resistor R104 via a resistor R103 (for example 100Ω). Both output terminals of a photo coupler U101 are connected to both ends of the resistor R104. The other end of the resistor R104 (for example 7.5 kΩ) is connected to an output line $1_{out}$. The output line $1_{out}$ is connected to a resistor R501 as reactance of the load L and a condenser C501 as capacitance of the load L through a simulation resistor R152 (for example 1Ω).

The drain of the Nch MOS FET Q201 in the negative side of the output stage is connected to the output line $1_{out}$ and the source of the Nch MOS FET Q201 is connected to the drain of the Nch MOS FET Q202. The source of the Nch MOS FET Q202 is connected to one end of a resistor R 203 (for example 100Ω). The other end of the resistor R203 is connected to one end of a resistor R204 (for example 7.5 kΩ). Both output terminals of the photo coupler U201 are connected to both ends of the Resistor 204. The other end of the resistor R204 is connected to the high-voltage negative power source –HVps through a simulation resistor 8205 (for example 1Ω).

One end of a resistor R101 (for example 3000 kΩ) is connected to the drain of the Nch MOS FET Q101 and the other end of the resistor R101 is connected to one end of a simulation resistor R106 (for example 1Ω), of which the other end is connected to the gate of the Nch MOS FET Q101, and one end of a resistor R102 (for example 3000 kΩ). The other end of the resistor R102, the gate of the Nch MOS FET Q102, one end of the condenser C101 (for example 10 μF), and a cathode end of a Zener diode D102 are connected to each other. The other end of the condenser C101, the anode end of the Zener diode D102, the drain of the Nch MOS FET Q201, and one end of a resistor R201 (for example 3000 kΩ) are connected to the output line $l_{out}$.

The other end of the resistor R201, one end of a simulator resistor R206 (for example 1Ω) of which the other end is connected to and the gate of the Nch MOS FET Q201, and one end of a resistor 8202 (for example 3000 kΩ) are connected to each other. The other end of the resistor R202, the gate of the Nch MOS FET Q202, a cathode end of a Zener diode D202, and one end of a condenser C201 (for example 10 μF) are connected to each other. The anode end of the Zener diode D202 and the other end of the condenser C201 are connected to the high-voltage negative power source −HVps via the simulator resistor R205 (for example 1Ω). Between the source and the gate of the Nch MOS FET Q201, a Zener diode D201 is bridged (the cathode of the Zener diode D201 is connected to the gate of the Nch MOS FET Q201, the anode of the Zener diode D201 is connected to the source of the Nch MOS FET Q201).

As mentioned above, the other end of the condenser C201 and the anode of the Zener diode D202 are connected to the high-voltage negative power source −HVps via the resistor 205. The gate of the Nch MOS FET Q101 and the gate of the Nch MOS FET Q201 are connected via a series circuit including a condenser C151 (for example 1000 pF) and a resistor R151 (for example 100Ω).

The input stage of the high-voltage output amplifier comprises an operational amplifier U1, a photo coupler U101, and a photo coupler U201. An output terminal of the operational amplifier U1 is connected to an input terminal of the photo coupler U101 via a resistor R5 (for example 470Ω) and to an input terminal of the photo coupler U201 via a resistor R6 (for example 470Ω). Both output terminals (corrector and emitter of a phototransistor) of the photo coupler U101 are connected to the both ends of the resistor R104 (for example 7.5 kΩ) in the output stage and both output terminals (corrector and emitter of a phototransistor) of the photo coupler U201 are connected to the both ends of the resistor R204 (for example 7.5 kΩ) in the output stage. The output of the high-voltage output amplifier is fed back to an input terminal (−) of the operational amplifier U1 through a circuit composed of a parallel circuit of a resistor R4 with a condenser C4, a parallel circuit of a resistor R3 with a condenser C3, and a parallel circuit of a resistor R2 with a condenser C2 in which these parallel circuits are connected in series.

The Nch MOS FETs Q101, Q102, Q201, Q202 are high withstand voltage Nch MOS FETs. Assuming that the high withstand voltage positive and negative power sources ±HVps are ±3100V, the high withstand voltage Nch MOS FETs are required to have withstand voltage exceeding 3100V, preferably 4000V for ensuring the operation. The Zener diode D102 always gives its Zener voltage (for example 10V) rather than output voltage to the gate of the Nch MOS FET Q102. The condenser C101 (for example 10 μF) has a function of achieving stabilization by eliminating ripples of the voltage 10V and thus exerts an effect of keeping the gate of the Nch MOS FET Q102 in a low impedance state.

The resistor R101 and the resistor R102 have the same resistance value (for example 3000 kΩ) and divide a differential voltage (for example 3090V) between the voltage of the high-voltage positive power source (for example +3100V) and the output voltage of the output line $l_{out}$ (for example +10V) to provide a gate voltage to the gate of the Nch MOS FET Q101. The voltage distribution between the drain and the source of the Nch MOS FET Q101 and the voltage distribution between the drain and the source of the Nch MOS FET Q102 are substantially equal. In case of an output −3000V, the voltages between the drains and the sources of the Nch MOS FETs Q101 and Q102 become the maximum and voltages about 3050V are applied respectively.

The Zener diode D202 of which Zener voltage is about 10V applies a voltage, which is always higher than the voltage (for example −3100V) of the high-voltage negative power source −HVps by the Zener voltage (10V), to the gate of the Nch MOS FET Q202. The condenser C201 is provided for achieving stabilization by eliminating ripples of the Zener voltage 10V and exerts an effect of keeping the gate of the Nch MOS FET Q202 in a low impedance state. The resistor R201 and the resistor R202 have the same resistance value (for example 3000 kΩ) and divide a differential voltage between the voltage of the high-voltage negative power source −HVps (strictly a voltage −3090V obtained by adding +10V to the voltage of the high-voltage negative power source −HVps −3100V) and the output voltage to provide an electric potential to the gate of the Nch MOS FET Q201. The voltage distribution between the drain and the source of the Nch MOS FET Q201 and the voltage distribution between the drain and the source of the Nch MOS FET Q202 are substantially equal. In case of an output +3000V, the voltages between the drains and the sources of the Nch MOS FETs Q201 and Q202 become the maximum and voltages about 3050V are applied respectively.

If the output current of the photo coupler U101 is 0 and, for example, the resistance value of the resistor R103 is 100Ω and the resistance value of the resistor R104 is 7.51a the current flowing through the resistor R103 is 6V/7.6 kΩ≈0.8 mA because a voltage 6V obtained by subtracting a voltage Vgs (for example 4V in this case) between the source and the gate of the Nch MOS FET Q102 from the Zener voltage 10V of the Zener diode D102 is applied to the both ends of a series circuit composed of the resistors R103 and R104. This current value is the minimum drain current of the Nch MOS FETs Q101 and Q102 at no load.

If the output current of the photo coupler U201 is 0, the current flowing through the resistor R203 is 6V/7.6 kΩ≈0.8 mA because a voltage 6V obtained by subtracting a voltage Vgs (for example 4V in this case) between the source and the gate of the Nch MOS FET Q202 from the Zener voltage 10V of the Zener diode D202 is applied to the both ends of a series circuit composed of the resistors R203 and R204. This current value is the minimum drain current of the Nch MOS FETs Q201 and Q202.

The DC gain of the operational amplifier U1 is {(R2+R3+R4)/R1}+1. If R1=10 kΩ, R2=1000 kΩ, R3=1000 kΩ, R4=1000 kΩ, the DC gain increases 301 times. The reason why the feedback voltage is divided by three resistors R2, R3, R4 is because the high feedback voltage is gradually decreased by the three resistors. The frequency band of the amplifier of this embodiment depends on the condensers C2, C3, C4 connected in parallel to the resistors R2, R3, R4. Assuming C2=10 pF, C3=10 pF, C4=10 pF, the frequency should be 1/(2π·1000 kΩ·10 pF)≈16 kHz.

The output of the operational amplifier U1 is fed to the photo coupler U101 through the resistor R5 and to the photo coupler U201 through the resistor R6. Collector output of a photo transistor as a light receiving section of the photo coupler U101 drives (controls current at) the source of the Nch MOS FET Q102, while collector output of a photo transistor as a light receiving section of the photo coupler U201 drives (controls current at) the source of the Nch MOS FET Q202. The photo coupler U101 functions to isolate a high-voltage circuit driven by a high positive voltage (+3100V or more) of the high-voltage positive power source +HVps from a low-voltage circuit driven by a low positive voltage (+15V) of the low-voltage positive power source +V, while the photo coupler U201 functions to isolate a high-voltage circuit driven by a high negative voltage (−3100V or less) of the high-voltage negative power source −HVps from a low voltage circuit driven by a low negative voltage (−15V) of the low-voltage negative power source −V.

The withstand voltage of the high-voltage output amplifier of this embodiment between the input and the output thereof is required to be more than the high withstand positive voltage (+3100V in this example) of the high-voltage positive power source +HVps or less than the high withstand negative voltage (−3100V in this example) of the high-voltage negative power source −HVps. Collector output of the photo transistor as the light receiving section of the photo coupler U101 drives the low impedance source of the Nch MOS FET Q102, while collector output of the photo transistor as the light receiving section of the photo coupler U201 drives the low impedance source of the Nch MOS FET Q202. Therefore, the photo coupler U101 and the photo coupler U201 can losslessly reflect performances described in the data sheet without performance deterioration.

If a voltage Vin of +5V, for example, is inputted to a plus input terminal of the operational amplifier U1, the output becomes +1505V. If the resistance value of the resistor R501 of the load L is 100 kΩ, for example, current flowing through the resistor R501 becomes +15.05 mA. The output of the operational amplifier U1 drives a light-emitting diode as a light emitting section of the photo coupler U101 so that the Nch MOS FET Q101 and the Nch MOS FET Q102 operate to supply the current +15.05 mA to the resistor R501 of the load L from the high-voltage positive power source +HVps. If a voltage −5V, for example, is inputted to the plus input terminal of the operational amplifier U1, the output becomes −1505V and the current flowing through the resistor R501 of the load L becomes −15.05 mA. The operational amplifier U1 drives a light-emitting diode as a light emitting section of the photo coupler U201 so that the Nch MOS FET Q201 and the Nch MOS FET Q202 operate to cause (draw) −15.05 mA in the resistor R501 of the load L from the high voltage negative power source −HVps.

Diodes D1 and D2 connected to the input terminals of the photo couplers U101 and U201 are provided, respectively, to protect the light-emitting diodes as the light-emitting sections of the photo couplers U101 and U201 from input voltage in reverse direction and also to prevent the light emitting diode from emitting light by means of voltage applied in reverse direction. In addition, diodes D3, D4 connected to a minus input terminal of the operational amplifier U1 are provided to protect the minus input terminal from overvoltage input. The Zener diodes D101 and D201 bridged between the sources and gates of the Nch MOS FETs Q101 and Q201 are provided to protect the respective gates in case that overvoltage is inputted to the Nch MOS FET Q101, Q201. Furthermore, resistors R7 and R8 are provided to reduce zero-crossover distortion.

The condenser C151 arranged between the gate of the Nch MOS FET Q101 and the gate of the Nch MOS FET Q201 is an important condenser for providing characteristics of the high-voltage output amplifier of this embodiment. In case of decreasing output voltage, the Nch MOS FET Q101 operates to lower the current flowing through the drain, thus reducing the voltage between the gate and source. That is, the Nch MOS FET Q101 discharges electrical charge stored in the gate thereof. On the other hand, the Nch MOS FET Q201 operates to increase the current flowing through the drain, thus increasing the voltage between the gate and source. That is, the Nch MOS FET Q201 sucks and stores electrical charge in the gate thereof. In case of increasing output voltage, the aforementioned actions occur in reverse.

In the aforementioned high-voltage output amplifier, assuming that the voltage of the high-voltage positive power source +HVps is 3100V, the voltage of the high-voltage negative power source −HVps is −3100V, and the output voltage is +1000V, the gate voltage $V_{Q101\text{-}G}$ of the Nch MOS FET Q101 is: (3100V−1000V−10V)/2+1000V+10V=2055V the gate voltage $V_{Q201\text{-}G}$ of the Nch MOS FET Q201 is: 1000V−(3100V+1000V−10V)/2=−1045V Therefore, the voltage $V_{C151}$ at both ends of the condenser C151 is:

2055V−(−1045V)=3100V.

If the output voltage is −1000V, the gate voltage $V_{Q101\text{-}G}$ of the Nch MOS FET Q101 is: 3100V−{3100V−(−1000V)−10V}/2=1055V the gate voltage $V_{Q201\text{-}G}$ of the Nch MOS FET Q201 is: −1000V−(3100V−1000V−10V)/2=2045V Therefore, the voltage $V_{C151}$ at both ends of the condenser C151 is:

1055V−(−2045V)=3100V.

It was found from the above results that the voltage at both ends of the condenser C151 is always constant independently of the output voltage. Since the condenser C151 does not affect voltage distribution when the circuit of the high-voltage output amplifier operates ideally, it is clear that the condenser C151 can be arranged between the gate of the Nch MOS FET Q101 and the gate of the Nch MOS FET Q201 with no trouble at all. Instead, it was also found that the condenser C151 limits variation in voltage at both ends of the condenser C151. That is, the condenser C151 serves an important function of approximating ideal operation of the circuit of the high-voltage output amplifier. The target of the capacitance value of the condenser C151 is twice of the input capacitance of the gates of the Nch MOS FET Q101 and the Nch MOS FET Q201 or more.

Now, it will be described in detail. If the circuit shown in FIG. 2 operates ideally, relative to any output voltage, the gate voltage $V_{Q101\text{-}G}$ of the Nch MOS FET Q101 is:

$$V_{Q101\text{-}G} = (+HVps - V_{OUT} - V_{D102})/2 + V_{OUT} + V_{D102}$$
$$= (+HVps + V_{OUT} + V_{D102})/2$$

the gate voltage $V_{Q201\text{-}G}$ of the Nch MOS FET Q201 is:

$$V_{Q201\text{-}G} = V_{OUT} - \{V_{OUT} - (-HVps) - V_{D202}\}/2$$
$$= \{(-HVps + V_{OUT} + V_{D202})/2$$

Therefore, the voltage $V_{C151}$ at both ends of the condenser C151 is:

$$V_{C151} = V_{Q101\text{-}G} - V_{Q201\text{-}G}$$
$$= (+HVps + V_{OUT} + V_{D102})/2 - \{(-HVps) + V_{OUT} + V_{D202}\}/2$$
$$= +HVps/2 - (-HVps)/2 = 3100 \text{ V}$$

It was found also from the above results that the voltage at both ends of the condenser C151 is always constant independently of the output voltage.

As described in the above, the movements of charges of the Nch MOS FET Q101 and the Nch MOS FET Q201 are opposite to each other. In other words, the gate of the Nch MOS FET Q101 and the gate of the Nch MOS FET Q201 satisfy the interplay of supply and demand. This is achieved by the condenser C151 arranged between the gate of the Nch MOS FET Q101 and the gate of the Nch MOS FET Q201. That is, the condenser C151 decreases impedances at the gate of the Nch MOS FET Q101 and the gate of the Nch MOS FET Q201 to make these Nch MOS FETs operate in pseudo grounded gate manner. Because of the condenser C151 arranged between the gate of the Nch MOS FET Q101 and the gate of the Nch MOS FET Q201, the gate of the Nch MOS FET Q101 and the gate of the Nch MOS FET Q201 satisfy the interplay of supply and demand of charges. The condenser C151 can be replaced by any other means which can make the gate of the Nch MOS FET Q101 and the gate of the Nch MOS FET Q201 satisfy the interplay of supply and demand of charges. That is, any other means which can decrease impedances at the gate of the Nch MOS FET Q101 and the gate of the Nch MOS FET Q201 to make these Nch MOS FETs operate in pseudo grounded gate manner may be used.

Since the Nch MOS FET Q101 and the Nch MOS FET Q201 operate in the grounded gate manner, the operation of the Nch MOS FETs Q101 and Q102 and the operation of the Nch MOS FETs Q201 and Q202 coincide so as to improve the operation of the circuit very much. The resistor R151 connected to the condenser C151 in series is provided for preventing unwanted vibration at the gates of the Nch MOS FETs Q101 and Q201.

The simulation resistors R105, 8205, and R152 are of no value for the circuit characteristics and are provided for watching currents flowing therethrough. The diodes D1, D2 are provided for exhibiting an effect of protecting the light-emitting diodes (LED) of the photo couplers U101, U201 from input voltage in the reverse direction and preventing the light emitting diodes from emitting light with the voltage applied in the reverse direction.

FIG. 3 through FIG. 10 are diagrams showing sine response waveforms of the high-voltage output amplifier according to the present invention (the high-voltage output simplifier having the circuit configuration shown in FIG. 2) in which the input frequencies are 1 Hz, 10 Hz, 100 Hz, and 1000 Hz. It should be noted that "Condenser C151=0.01 pF" substantially equals a situation without the condenser C151. In those figures, $V_{C151}$ represents a voltage waveform between both ends of the condenser C151, $V_{OUT}$ represents an output voltage waveform, $V_{Q101-G}$ represents a gate voltage waveform of the Nch MOS FET Q101, and $V_{Q201-G}$ represents a gate voltage waveform of the Nch MOS FET Q201.

Figure 3:
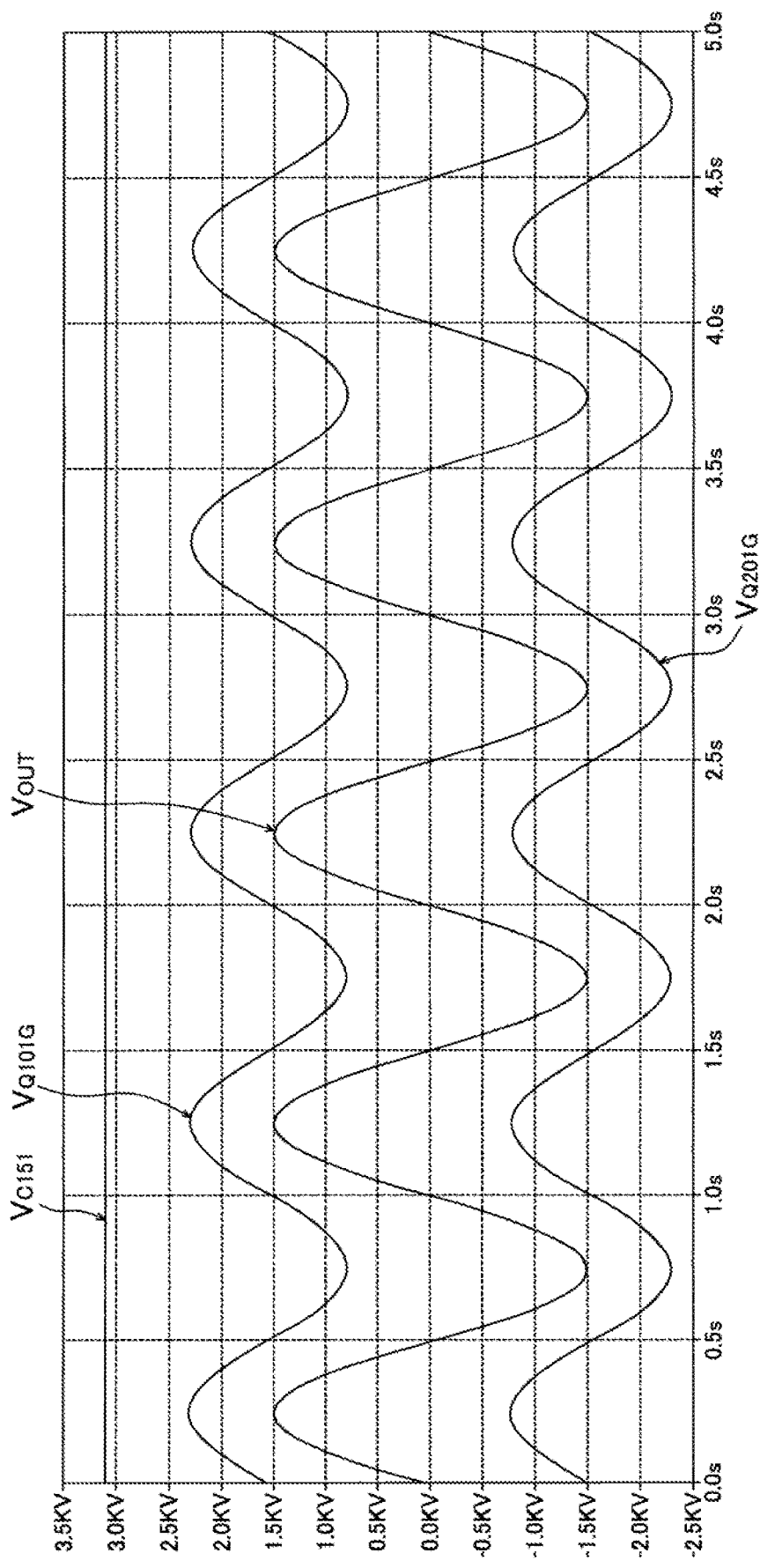
FIG. 3 is a diagram showing sine response waveforms of the high-voltage output amplifier according to the present invention.

FIG. 3 shows sine response waveforms of the high-voltage output amplifier shown in FIG. 2 in case that the capacitance value of the condenser C151 is 0.01 pF and the input frequency is 1 Hz. It is found that, with the sinusoidal input frequency 1 Hz, the voltage $V_{C151}$ between both ends of the condenser C151 is substantially constant and the ideal operation of the high-voltage output amplifier is substantially maintained even without the condenser C151 between the gate of the Nch MOS FET Q101 and the gate of the Nch MOS FET Q201.

Figure 4:
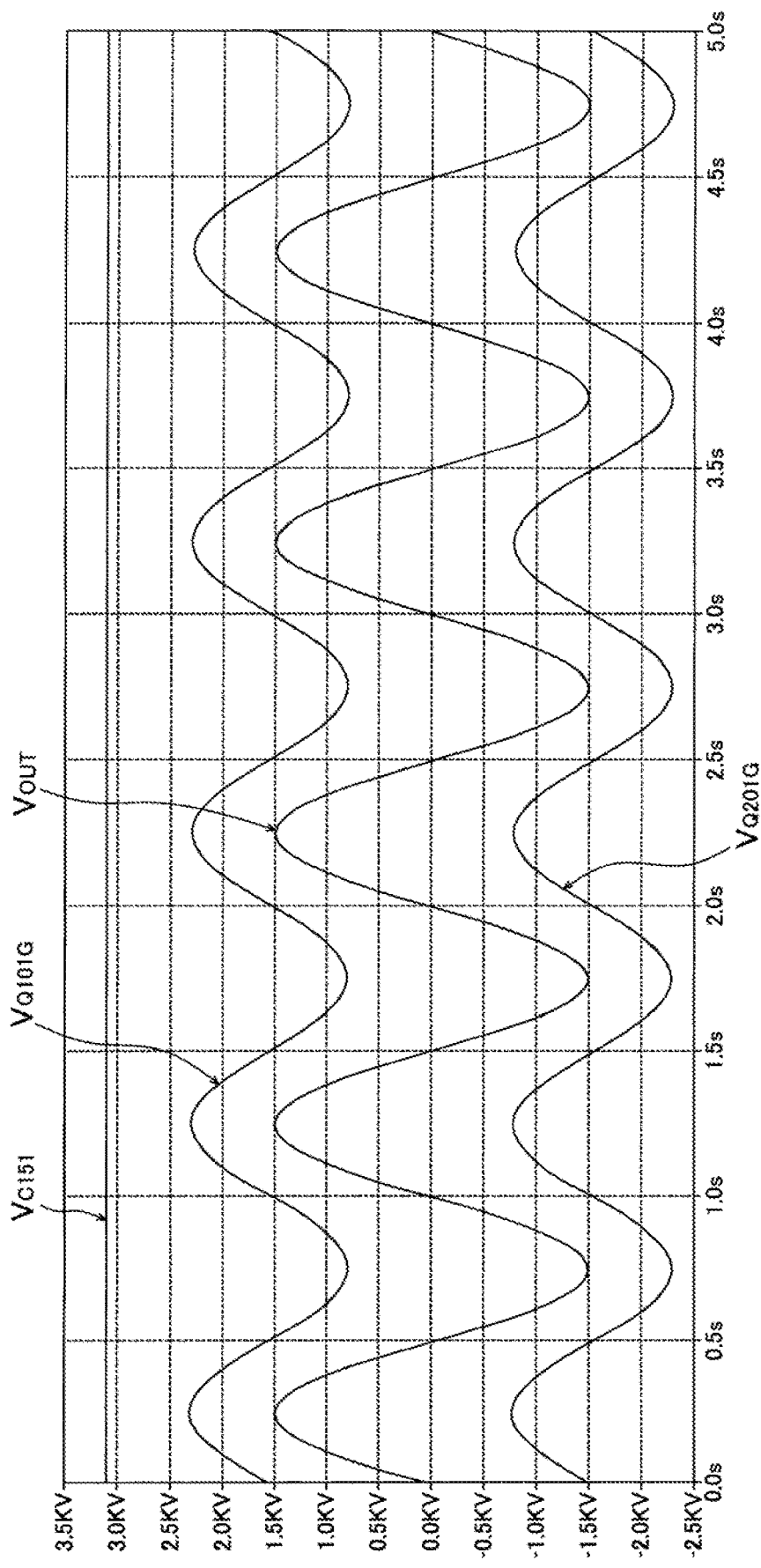
FIG. 4 is a diagram showing sine response waveforms of the high-voltage output amplifier according to the present invention.

FIG. 4 shows sine response waveforms in case of condenser C151=1000 pF and the sinusoidal input frequency 1 Hz. In this case, the voltage $V_{C151}$ between both ends of the condenser C151 is substantially constant, and both of the gate voltage waveform $V_{Q101-G}$ of the Nch MOS FET Q101 and the gate voltage waveform $V_{Q201-G}$ of the Nch MOS FET Q201 have no abnormalities. Therefore, it is found that the high-voltage output amplifier operates without any problem.

Figure 5:
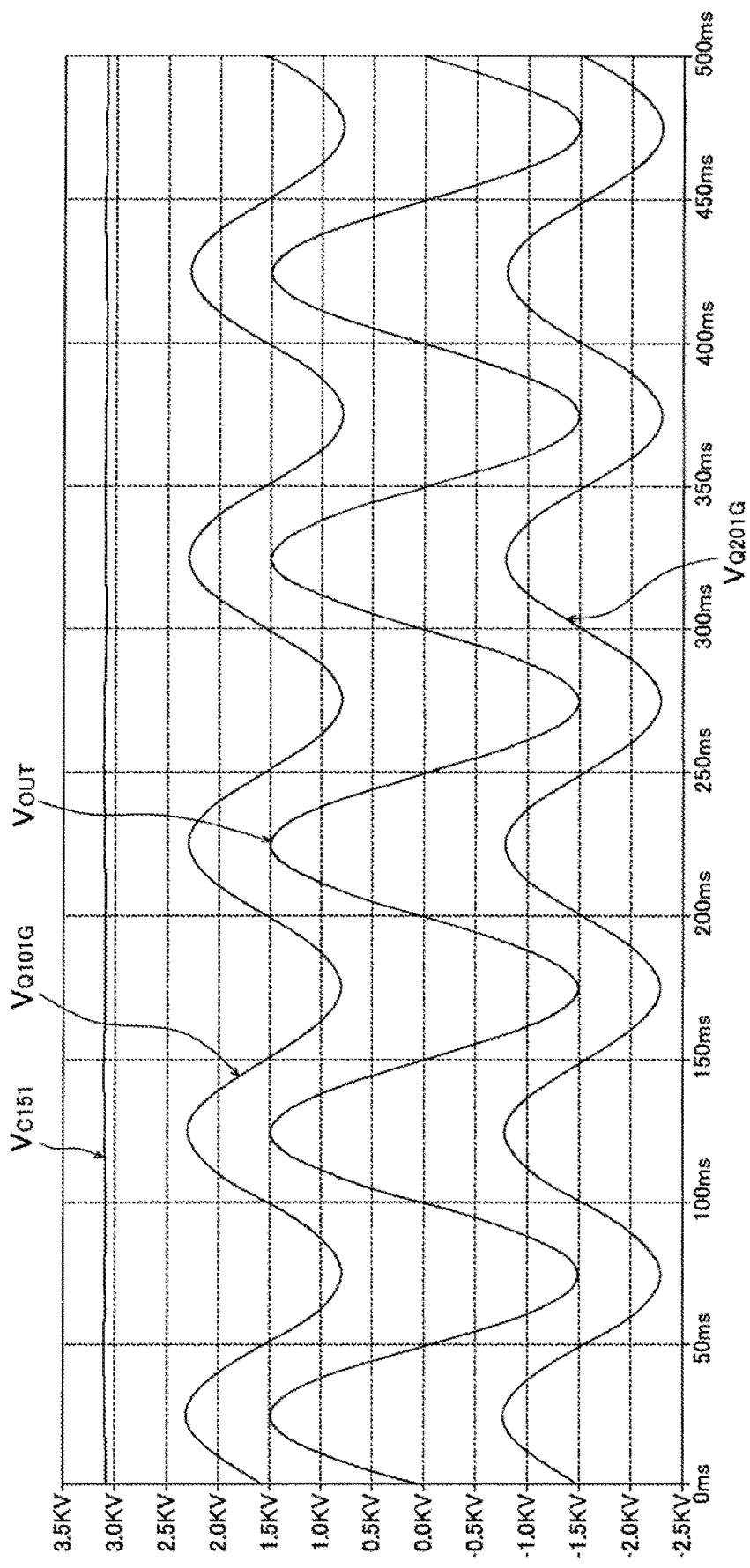
FIG. 5 is a diagram showing sine response waveforms of the high-voltage output amplifier according to the present invention.

FIG. 5 shows sine response waveforms in case of condenser C151=0.01 pF and the sinusoidal input frequency 10 Hz. In this case, the voltage $V_{C151}$ between both ends of the condenser C151 has minor variation, but both of the gate voltage waveform $V_{Q101-G}$ of the Nch MOS FET Q101 and the gate voltage waveform $V_{Q201-G}$ of the Nch MOS FET Q201 have no abnormalities. Therefore, it is found that the ideal operation of the high-voltage output amplifier is substantially maintained.

Figure 6:
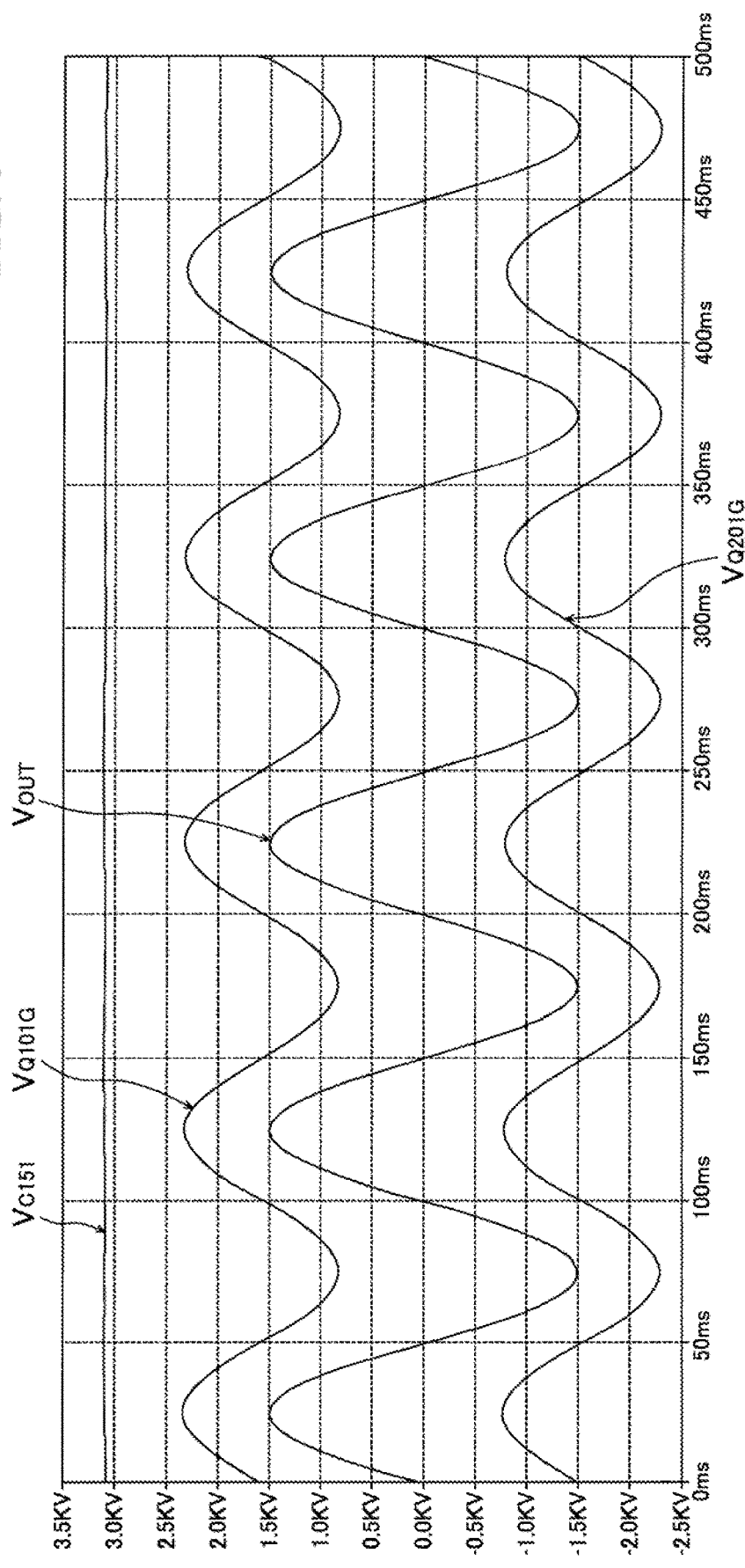
FIG. 6 is a diagram showing sine response waveforms of the high-voltage output amplifier according to the present invention.

FIG. 6 shows sine response waveforms in case of condenser C151=1000 pF and the sinusoidal input frequency 10 Hz. In this case, the voltage $V_{C151}$ between both ends of the condenser C151 has minor variation, but both of the gate voltage waveform $V_{Q101-G}$ of the Nch MOS FET Q101 and the gate voltage waveform $V_{Q201-G}$ of the Nch MOS FET Q201 have no abnormalities. Therefore, it is found that the ideal operation of the high-voltage output amplifier is substantially maintained.

Figure 7:
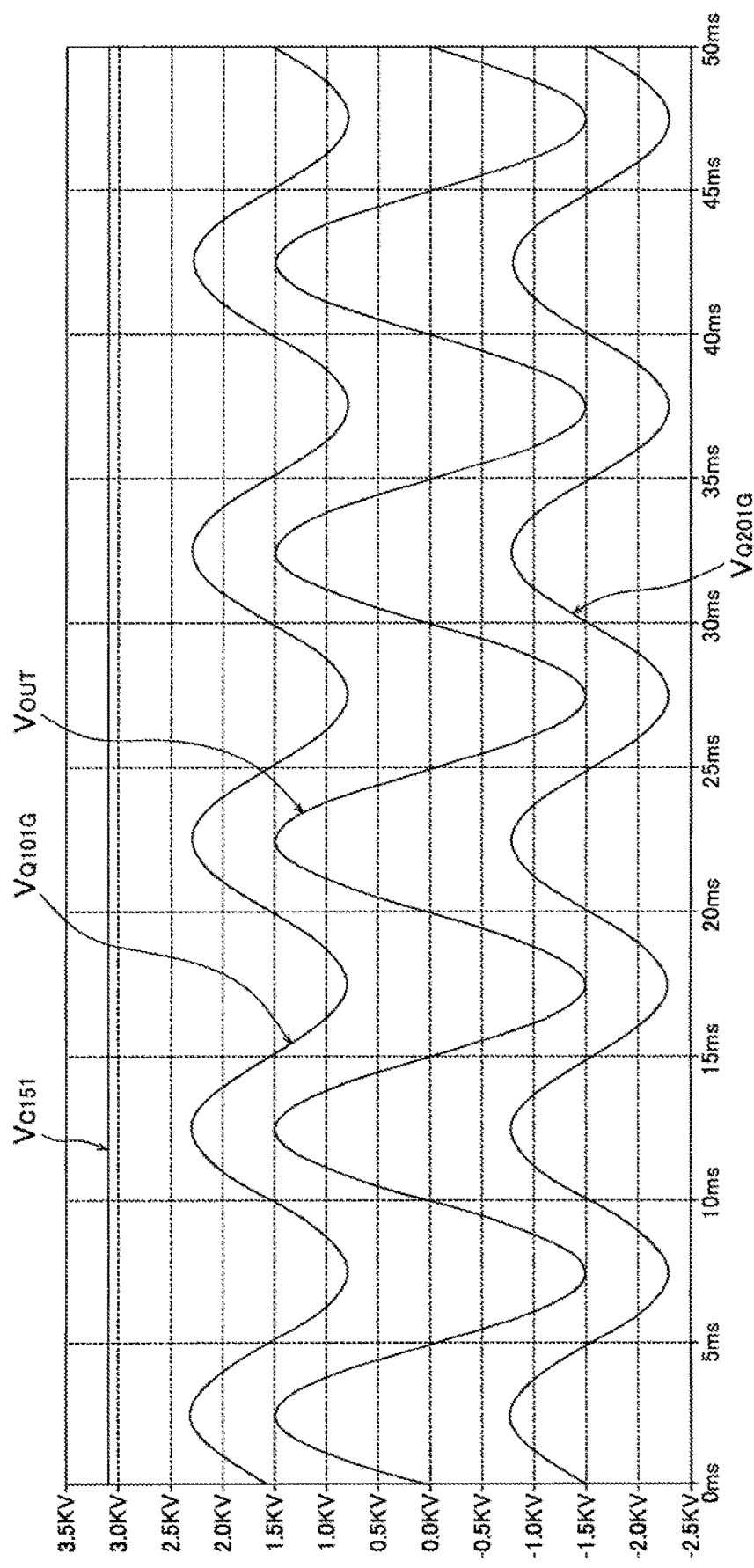
FIG. 7 is a diagram showing sine response waveforms of the high-voltage output amplifier according to the present invention.

FIG. 7 shows sine response waveforms in case of condenser C151=0.01 pF and the sinusoidal input frequency 100 Hz. In this case, the voltage $V_{C151}$ between both ends of the condenser C151 has minor variation, and the phases of the gate voltage $V_{Q101G}$ of the Nch MOS FET Q101 and the gate voltage $V_{Q201G}$ of the Nch MOS FET Q201 begin to shift a little from the phase of the output voltage $V_{OUT}$.

Figure 8:
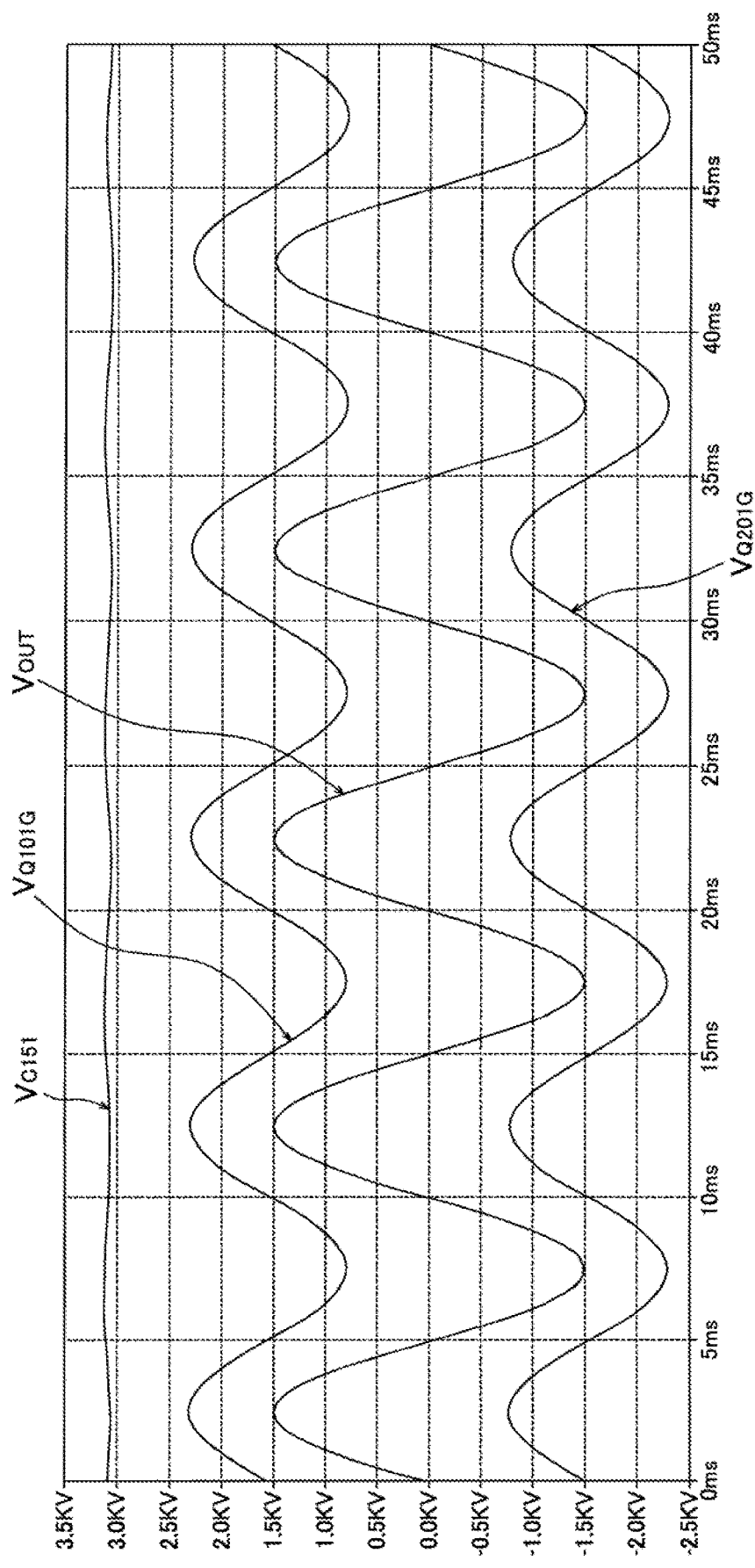
FIG. 8 is a diagram showing sine response waveforms of the high-voltage output amplifier according to the present invention.

FIG. 8 shows sine response waveforms in case of condenser C151=1000 pF and the sinusoidal input frequency 100 Hz. In this case, the voltage $V_{C151}$ between both ends of the condenser C151 has some significant variation. This means that some electrical charges move between the gate of the Nch MOS FET Q101 and the gate of the Nch MOS FET Q201 via the condenser C151. Once the capacitance value of the condenser C151 is increased, the variation is reduced. It is found that the phases of the gate voltage $V_{Q101G}$ of the Nch MOS FET Q101 and the gate voltage $V_{Q201G}$ of the Nch MOS FET Q201 are substantially equal to the phase of the output voltage $V_{OUT}$.

Figure 9:
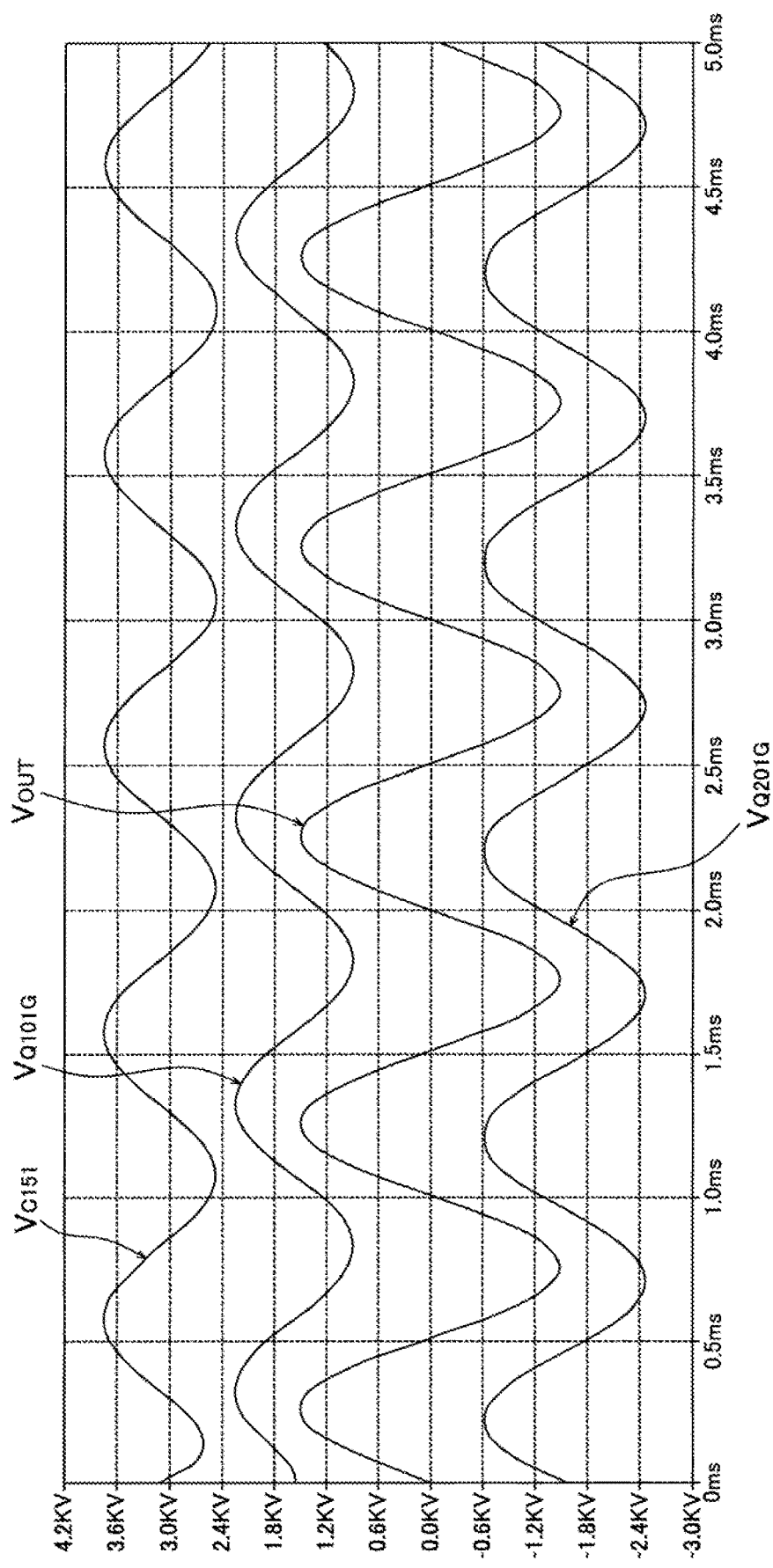
FIG. 9 is a diagram showing sine response waveforms of the high-voltage output amplifier according to the present invention.

FIG. 9 shows sine response waveforms in case of condenser C151=0.01 pF and the sinusoidal input frequency 1000 Hz. In this case, the voltage $V_{C151}$ between both ends of the condenser C151 has significant variation. This is because smooth movement (charge/discharge) of electrical charge to the gate input capacitance is not achieved between the gate of the Nch MOS FET Q101 and the gate of the Nch MOS FET Q201 since the capacitance value of the condenser C151 is 0.01 pF (it is substantially equal to that the condenser C151 is not mount). It is also found that, with the input of frequency 1000 Hz, the phases of the gate voltage $V_{Q101G}$ of the Nch MOS FET Q101 and the gate voltage $V_{Q201G}$ of the Nch MOS FET Q201 considerably shift from the phase of the output voltage $V_{OUT}$.

Figure 10:
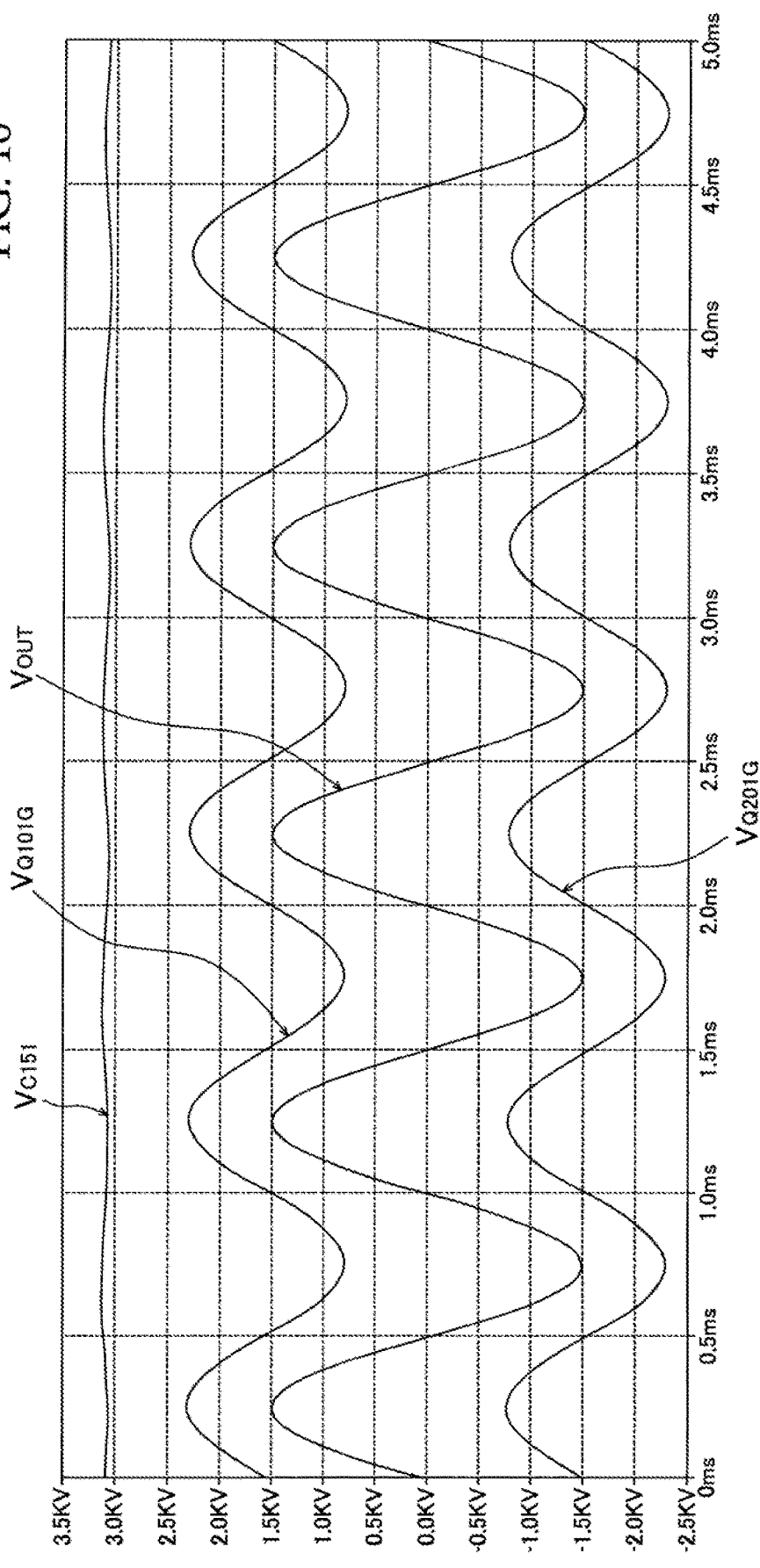
FIG. 10 is a diagram showing sine response waveforms of the high-voltage output amplifier according to the present invention.

FIG. 10 shows sine response waveforms in case of condenser C151=1000 pF and the sinusoidal input frequency 1000 Hz. In this case, the voltage $V_{C151}$ between both ends of the condenser C151 has minor variation, but the range of variation is considerably smaller than that in the case of the condenser C151=0.01 pF. It is found that, even with the input of frequency 1000 Hz, the phases of the gate voltage $V_{Q101G}$ of the Nch MOS FET Q101 and the gate voltage $V_{Q201G}$ of the Nch MOS FET Q201 are substantially equal to the phase of the output voltage $V_{OUT}$.

Figure 11:
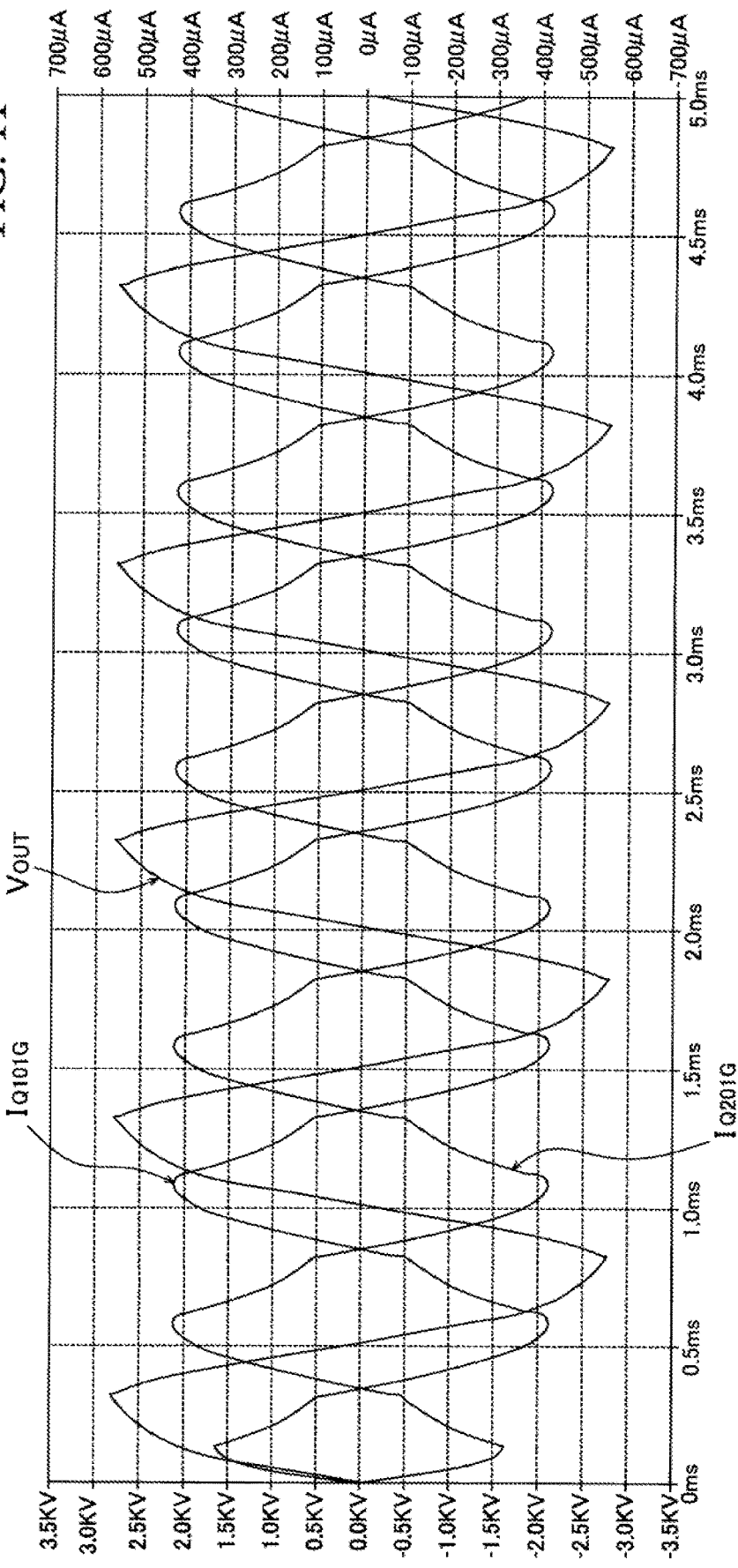
FIG. 11 is a diagram showing sine response waveforms of the high-voltage output amplifier according to the present invention.
Figure 12:
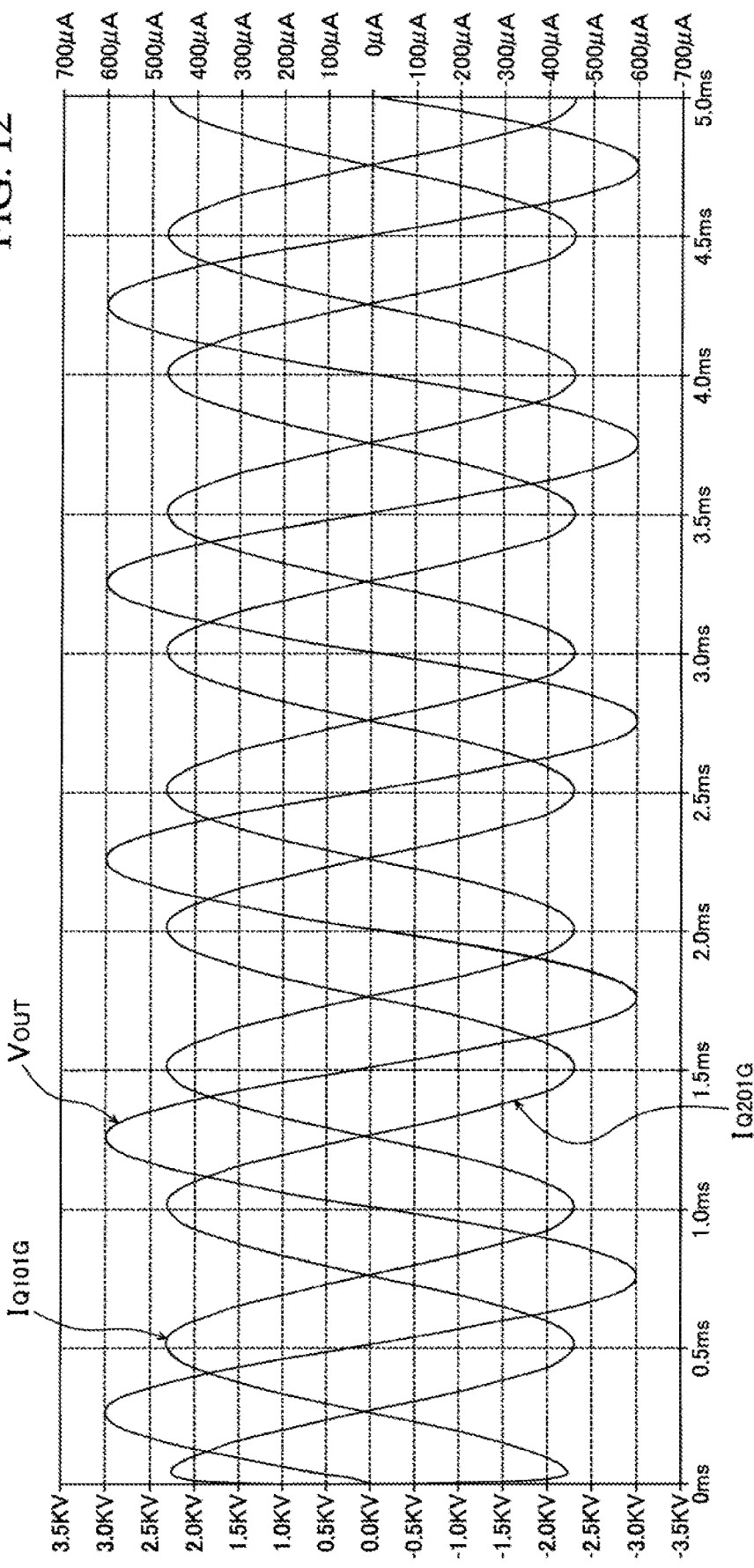
FIG. 12 is a diagram showing sine response waveforms of the high-voltage output amplifier according to the present invention.

The following is a description about the gate current $I_{Q101G}$ of the Nch MOS FET Q101 and the gate current $I_{Q201G}$ of the Nch MOS FET Q201. FIG. 11 and FIG. 12 are diagrams each showing a waveform of the gate current $I_{Q101G}$ of the Nch MOS FET Q101 and a waveform of the gate current $I_{Q201G}$ of the Nch MOS FET Q201, with sinusoidal input of frequency 1000 Hz and output voltage $V_{OUT}$±3000V, of the high-voltage output amplifier having the circuit configuration shown in FIG. 2. In these figures, the gate currents $I_{Q101G}$, $I_{Q201G}$ are indicated by right-side scale and the output voltage $V_{OUT}$ is indicated by left-side scale.

FIG. 11 shows a case of the condenser C151=0.1 pF. In this case, as for the way of the gate current $I_{Q101G}$ of the Nch MOS FET Q101, the current waveform of the gate current $I_{Q101G}$ has significant distortion because a value seen from the gate of the Nch MOS FET Q101 toward the resistors R101, R102 in FIG. 2 is high impedance of 1500 kΩ. As for the way of the gate current $I_{Q201G}$ of the Nch MOS FET Q201, the current waveform of the gate current $I_{Q201G}$ has significant distortion because a value seen from the gate of the Nch MOS FET Q201 toward the resistors R201, 8202 is high impedance of 1500 kΩ. The waveform of the output voltage $V_{OUT}$ distorts and does not reach an amplitude range of ±3000V.

FIG. 12 shows a case of the condenser C151=1000 pF. In this case, as for the directions of the gate current $I_{Q101G}$ of the Nch MOS FET Q101 and the gate current $I_{Q201G}$ of the Nch MOS FET Q201, the directions flowing into the gates are positive. The gate current $I_{Q101G}$ of the Nch MOS FET Q101 normally leads the output voltage $V_{OUT}$ by a phase angle of 90 degree, while the gate current $I_{Q201G}$ of the Nch MOS FET Q201 normally lags the output voltage $V_{OUT}$ by a phase angle of 90 degree. The gate current $I_{Q101G}$ of the Nch MOS FET Q101 and the gate current $I_{Q201G}$ of the Nch MOS FET Q201 have same amplitude and a phase difference of 180 degree (opposite relation) therebetween.

When the gate current $I_{Q101G}$ of the Nch MOS FET Q101 is in a positive half cycle (charges the input capacitance of the gate), the gate current $I_{Q201G}$ of the Nch MOS FET Q201 is in a negative half cycle (discharges the input capacitance of the gate). When the gate current $I_{Q101G}$ of the Nch MOS FET Q101 is in a negative half cycle, the flowing of current (the movement of charge) is reversed. This means that charge moves between the gate of the Nch MOS FET Q101 and the gate of the Nch MOS FET Q201 through the condenser C151.

At a point in time when the gate current $I_{Q101G}$ of the Nch MOS FET Q101 and the gate current $I_{Q201G}$ of the Nch MOS FET Q201 intersect with each other and thus become 0, the value (absolute value) of the output voltage $V_{OUT}$ becomes the maximum. That is, at a point in time when movement of charge between the gate of the Nch MOS FET Q101 and the gate of the Nch MOS FET Q201 is done, the absolute value of the output voltage $V_{OUT}$ becomes the maximum. When it operates to increase the current of the Nch MOS FET Q101, the input capacitance of the gate of the Nch MOS FET Q101 is charged (current is positive). On the other hand, during this operation, the current of the Nch MOS FET Q201 is reduced so that the input capacitance of the gate of the Nch MOS FET Q201 is discharged (current is negative). The condenser C151 provided between the gate of the Nch MOS FET Q101 and the gate of the Nch MOS FET Q201 functions as a channel for exchanging the charge therebetween, thereby achieving a symbiotic relationship between the Nch MOS FET Q101 and the Nch MOS FET Q201.

Figure 13:
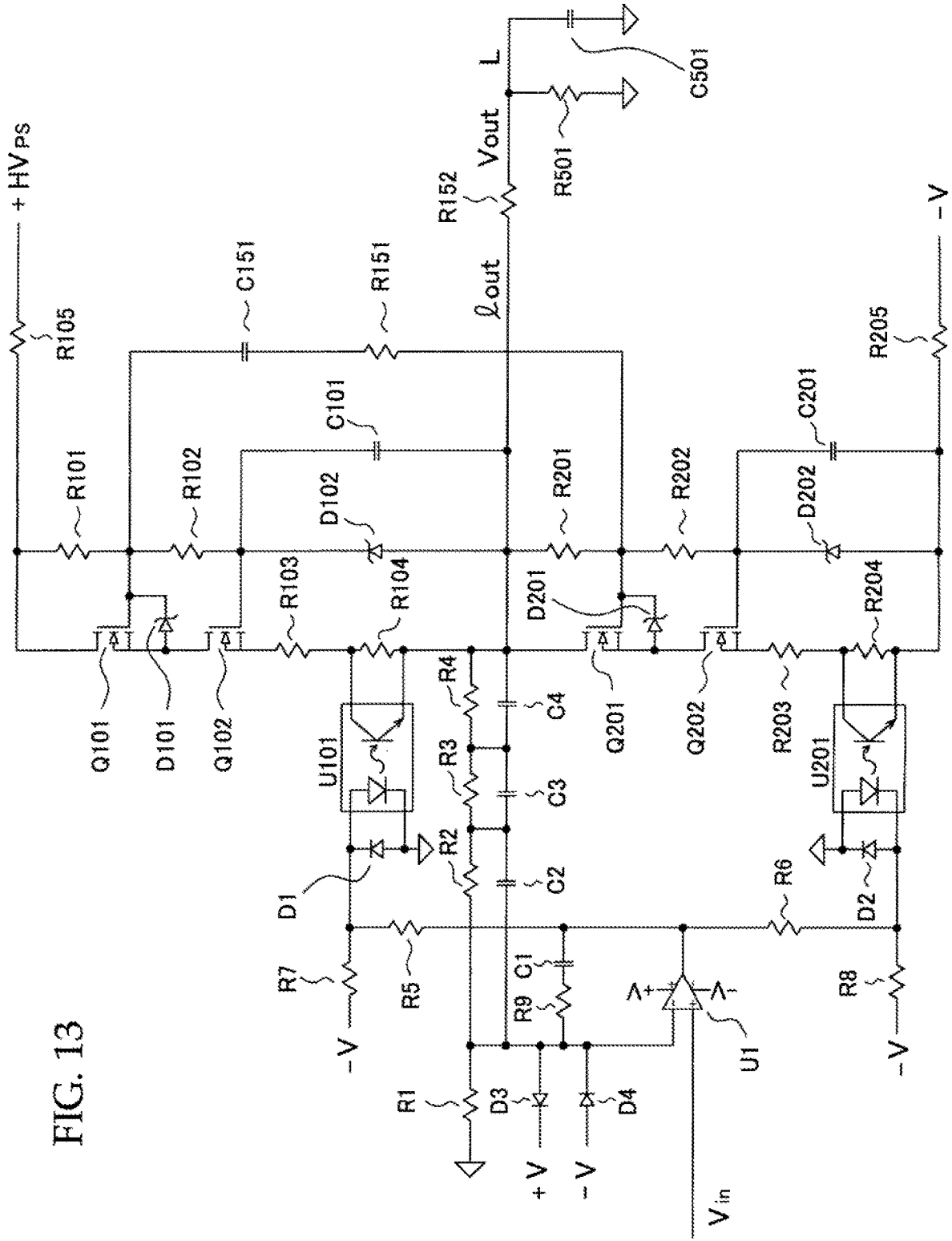
FIG. 13 is a drawing showing a circuit configuration example of the high-voltage output amplifier according to the present invention.

FIG. 13 is a drawing showing a circuit configuration example of a positive output high-voltage amplifier as a modification of the high-voltage output amplifier according to the present invention. In this figure, the same numerals as used in FIG. 2 designate the same parts. The same is true for cases as shown in FIGS. 14 through 18. The circuit configuration of the positive output high-voltage amplifier shown in FIG. 13 differs from that of FIG. 2 in that the voltage of the high-voltage positive power source +HVps shown in FIG. 2 is changed to +6100V and that the high-voltage negative power source −HVps is replaced by a low-voltage negative power source −V (−15V). While the high-voltage output amplifier of FIG. 2 can output positive voltages, negative voltages, or both positive and negative voltages as the output voltage $V_{OUT}$, the high-voltage output amplifier of FIG. 13 only outputs positive voltage as the output voltage $V_{OUT}$. Since the other components and actions of the circuit are similar to the circuit of FIG. 2, the description thereof will be omitted.

Figure 14:
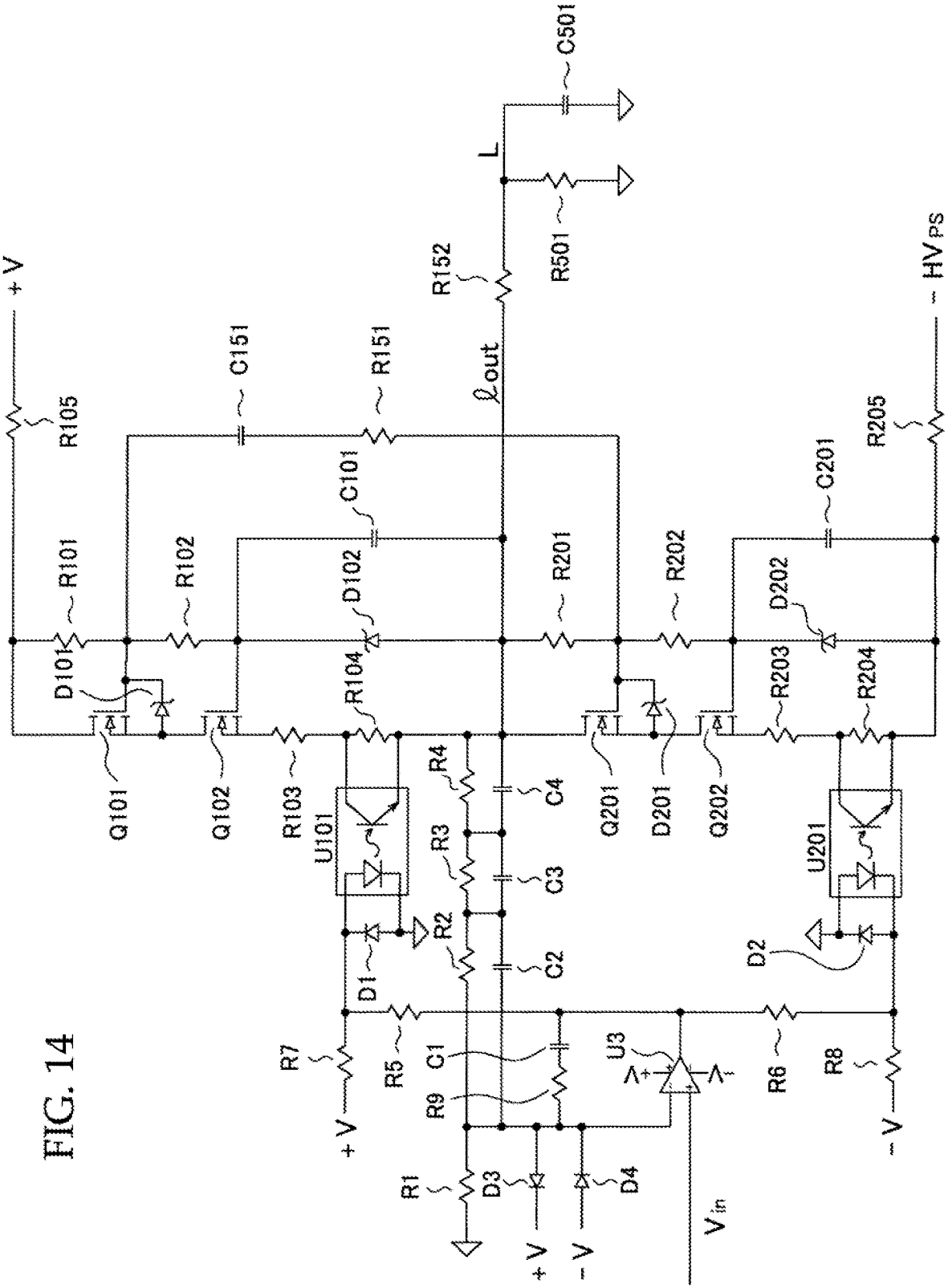
FIG. 14 is a drawing showing a circuit configuration example of the high-voltage output amplifier according to the present invention.

FIG. 14 is a drawing showing a circuit configuration example of a negative output high-voltage amplifier as a modification of the high-voltage output amplifier according to the present invention. The circuit configuration of the negative output high-voltage amplifier shown in FIG. 14 differs from that of FIG. 2 in that the high-voltage positive power source +HVps shown in FIG. 2 is replaced by a low-voltage positive power source +V (+15V), that the voltage of the high-voltage negative power source −HVps is changed to −6100V, and that the output voltage $V_{OUT}$ is only negative voltage. Since the other components and actions of the circuit are similar to the circuit of FIG. 2, the description thereof will be omitted.

Figure 15:
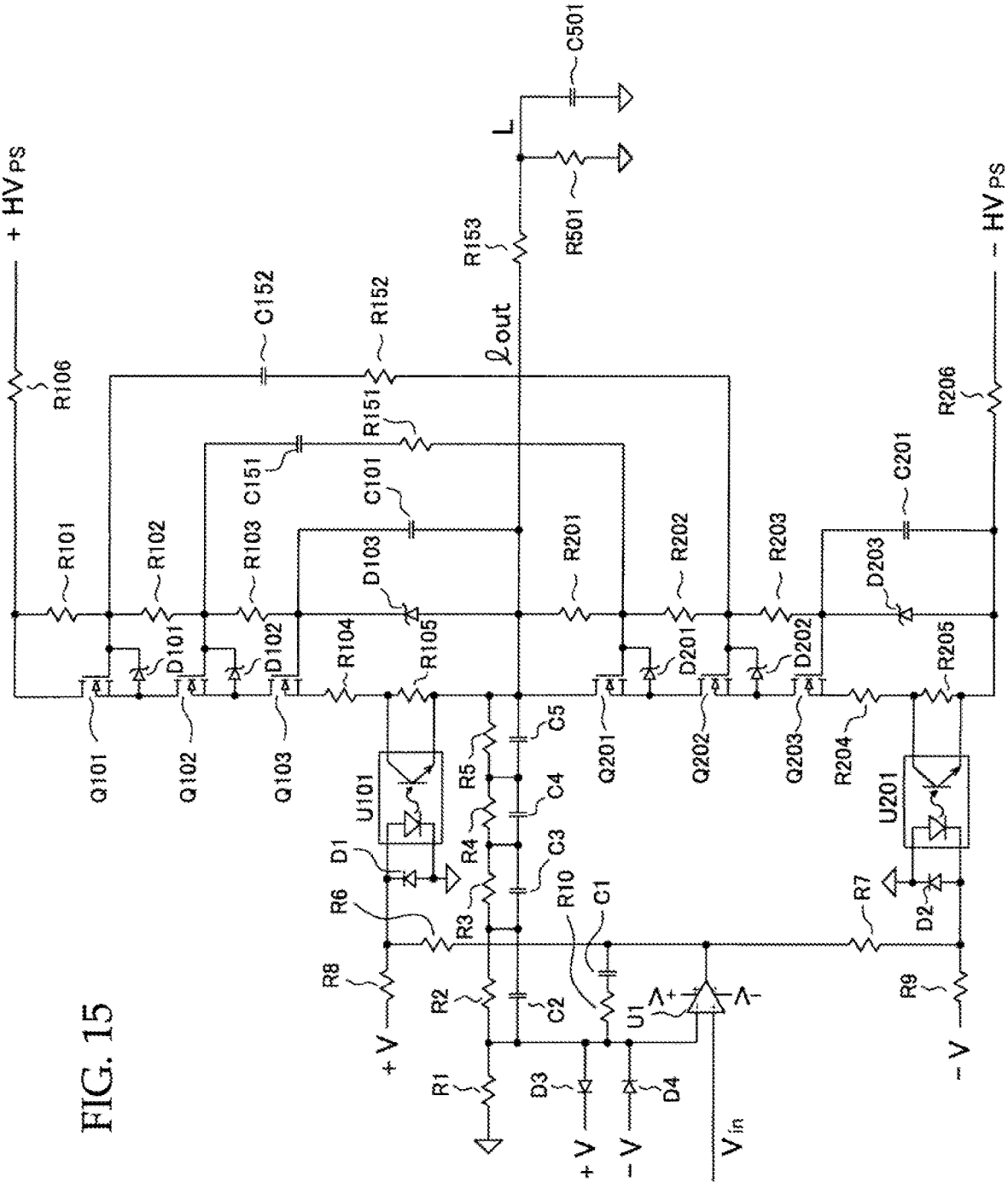
FIG. 15 is a drawing showing a circuit configuration example of the high-voltage output amplifier according to the present invention.

FIG. 15 is a drawing showing a modification of the high-voltage output amplifier according to the present invention. The circuit configuration of the high-voltage output amplifier shown in FIG. 15 differs from that of FIG. 2 in that positive-side and negative-side Nch MOS FETs are arranged to have three-stage configurations, respectively. That is, a Nch MOS FET Q101, a Nch MOS FET Q102, and a Nch MOS FET Q103 are arranged in the positive side, while a Nch MOS FET Q201, a Nch MOS FET Q202, and a Nch MOS FET Q203 are arranged in the negative side. In the positive side, the source of the Nch MOS FET Q101 and the drain of the Nch MOS FET Q102 are connected and the source of the Nch MOS FET Q102 and the drain of the Nch MOS FET Q103 are connected. In the negative side, the source of the Nch MOS FET Q201 and the drain of the Nch MOS FET Q202 are connected and the source of the Nch MOS FET Q202 and the drain of the Nch MOS FET Q203 are connected.

Between the gate of the Nch MOS FET Q102 and the gate of the Nch MOS FET Q103 in the positive side, a resistor R103 is connected. The source of the Nch MOS FET Q103 is connected to one end of a resistor R105 via a resistor R104. Both ends of the resistor R105 are connected to both output terminals of a photo coupler U101. The other end of the resistor R105 is connected to the output line $1_{out}$. In addition, a cathode terminal of a Zener diode D103, an end of a condenser C101, and the gate of the Nch MOS FET Q103 are connected. The other end of the resistor R105, the anode terminal of the Zener diode D103, and the other end of the condenser C101 are connected.

Between the gate of the Nch MOS FET Q202 and the gate of the Nch MOS FET Q203 in the negative side, a resistor 8203 is connected. The source of the Nch MOS FET Q203 is connected to one end of a resistor R205 via a resistor R204. Both ends of the resistor 8205 are connected to both output terminals of a photo coupler U201. In addition, a cathode terminal of a Zener diode D203, an end of a condenser C201, and the gate of the Nch MOS FET Q203 are connected. The other end of the resistor R205, the anode terminal of the Zener diode D203, and the other end of the condenser C201 are connected to the high-voltage negative power source −HVps through a simulator resistor 8206 (for example 1Ω).

A series circuit consisting of the condenser C151 and the resistor R151 is connected between the gate of the Nch MOS FET Q102 in the positive side and the gate of the Nch MOS FET Q201 (not Q202) in the negative side, while a series circuit consisting of the condenser C152 and the resistor R152 is connected between the gate of the Nch MOS FET Q101 in the positive side and the gate of the Nch MOS FET Q202 (not Q201) in the negative side. Accordingly, the condenser C151 between the gate of the Nch MOS FET Q102 and the gate of the Nch MOS FET Q201 and the condenser C152 between the gate of the Nch MOS FET Q101 and the gate of the Nch MOS FET Q202 each functions as a channel for exchanging the charge therebetween, thereby achieving a symbiotic relationship between the Nch MOS FET Q102 and the Nch MOS FET Q201 and a symbiotic relationship between the Nch MOS FET Q101 and the Nch MOS FET Q202. In this example, the voltage of the high-voltage positive power source +HVps shown in FIG. 2 is changed to +5300V and the voltage of the high-voltage negative power source −HVps is changed to −5300V. Because the circuit configuration as mentioned above is employed, a high-voltage output amplifier capable of outputting further higher voltage is provided. It should be noted that arranging Nch MOS FETs to have four or more stage configuration achieves a high-voltage output amplifier capable of outputting still further higher voltage.

For example, if Nch MOS FETs are arranged to have five-stage configurations so that Nch MOS FETs Q101, Q102, Q103, Q104, and Q105 are arranged in a positive side and Nch MOS FETs Q201, Q202, Q203, Q204, and Q205 are arranged in a negative side, series circuits, each consisting of a condenser C and a resistor R, are connected between gates of respective pairs of the Nch MOS FETs such that the Nch MOS FETs Q101, Q102, Q103, Q104 in the positive side correspond to the Nch MOS FETs Q204, Q203, Q202, Q201 in the negative side similarly to the case in FIG. 15, thereby achieving a super high-voltage output amplifier.

Figure 16:
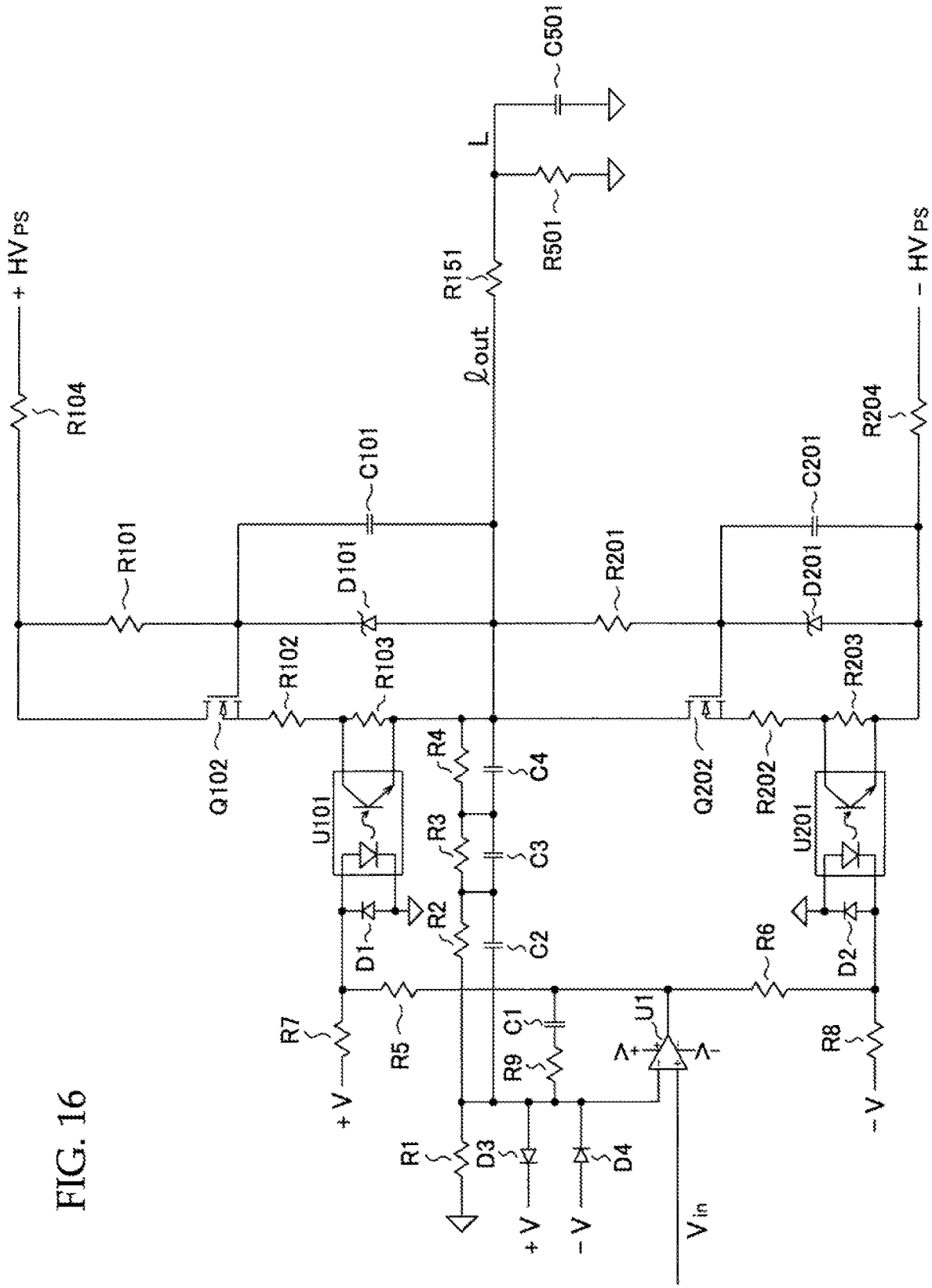
FIG. 16 is a drawing showing a circuit configuration example of the high-voltage output amplifier according to the present invention.

FIG. 16 is a drawing showing a modification of the high-voltage output amplifier according to the present invention. The circuit configuration of the high-voltage output amplifier shown in FIG. 16 differs from that of FIG. 2 in that Nch MOS FETs are arranged to have single-stage configurations in the positive and negative sides, respectively, that is, there is one Nch MOS FET Q102 in the positive side and one Nch MOS FET Q202 in the negative side. In this example, the voltage of the high-voltage positive power source +HVps shown in FIG. 2 is changed to +1600V and the voltage of the high-voltage negative power source −HVps is changed to −1600V.

The drain of the Nch MOS FET Q102 is connected to the high-voltage positive source +HVps via a simulator resistor R104, and a resistor R101 is connected between the drain and gate of the Nch MOS FET Q102. The source of the Nch MOS FET Q102 is connected to one end of a resistor R103 (for example 7.5 kΩ) via a resistor R102 (for example 100Ω). Both output terminals of a photo coupler U101 are connected to both ends of the resistor R103. A cathode of a Zener diode D101 and one end of a condenser C101 are connected. The anode of the Zener diode D101, the other end of the condenser C101, and the other end of the resistor R103 are connected to an output line $l_{out}$.

The source of the Nch MOS FET Q202 is connected via a resistor 8202 (for example 100Ω) to one end of a resistor 8203 (for example 7.5 kΩ) of which both ends are connected to output terminals of a photo coupler U201. The gate of the Nch MOS FET Q202 is connected via a resistor R201 to the output line $l_{out}$. A cathode of a Zener diode D201 and one end of a condenser C201 are connected to the gate of the Nch MOS FET Q202. The anode of the Zener diode D201, the other end of the condenser C201, the other end of the resistor R203 are connected to the high-voltage negative power source −HVps via a simulation resistor R204.

Figure 17:
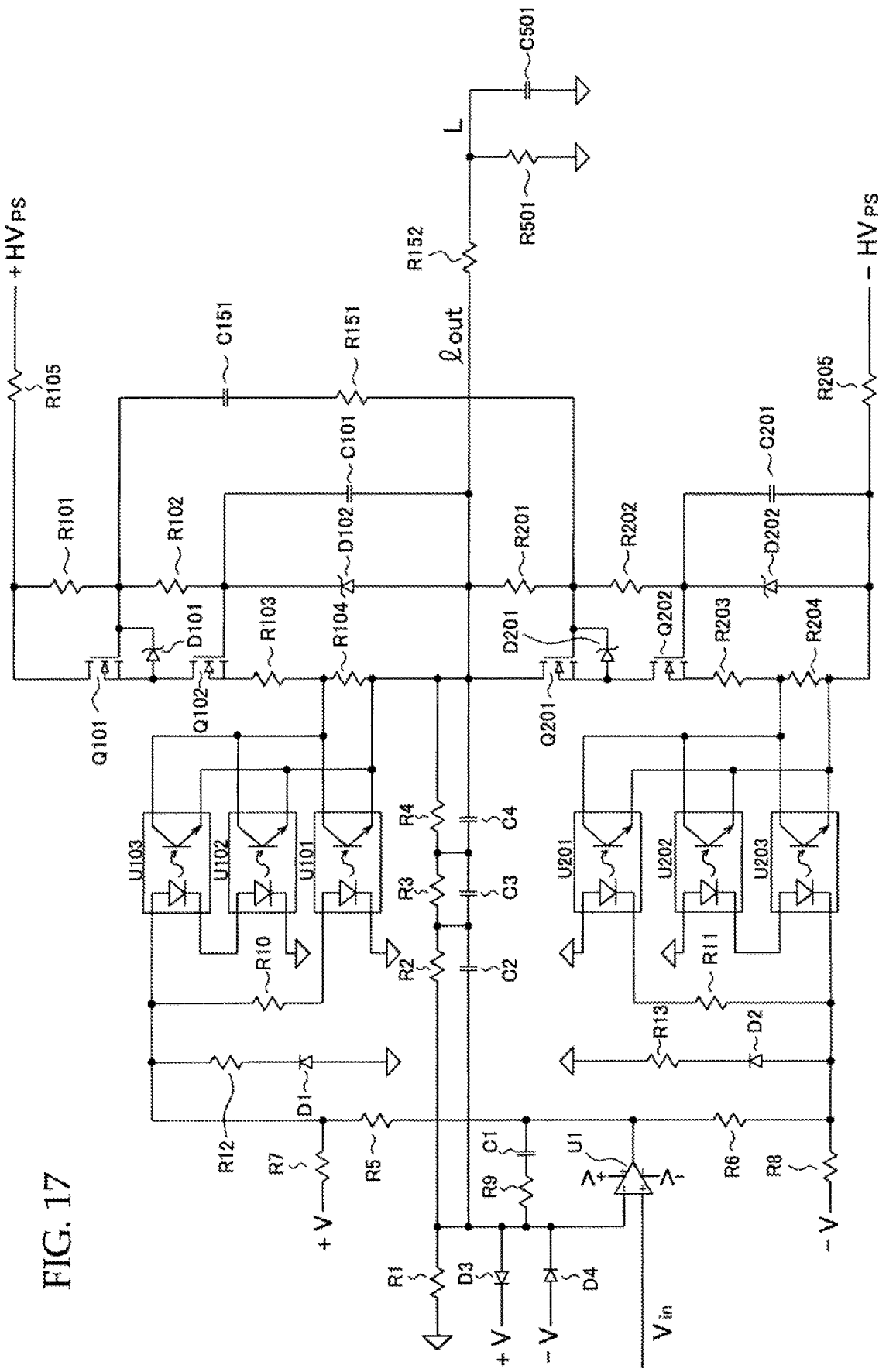
FIG. 17 is a drawing showing a circuit configuration example of the high-voltage output amplifier according to the present invention.

FIG. 17 is a drawing showing a modification of the high-voltage output amplifier according to the present invention. The circuit configuration of the high-voltage output amplifier shown in FIG. 17 differs from that of FIG. 2 in that there are three photo couplers U101, U102, U103 in a positive side and there are three photo couplers U201, U202, U203 in a negative side in order to increase output currents of the positive side and the negative side. Output of an operational amplifier U1 is inputted via a resistor R5 (for example 470Ω) into light-emitting diodes as light emitting sections of photo couplers U103, U102 in series and is further inputted via a resistor R10 (for example 100Ω) into a light-emitting diode as a light emitting section of a photo coupler U101 in the positive side. In addition, the output of the operational amplifier U1 is inputted via a resistor R6 (for example 470Ω) into light-emitting diodes as light emitting sections of photo couplers U203, U202 in series and is further inputted via a resistor R11 into a light emitting section of a photo coupler U201 in the negative side.

In positive side, collector currents of respective phototransistors as light-receiving parts of the photo couplers U101, U102, U103 are merged with each other and introduced into a resistor R104. In the negative side, collector currents of respective phototransistors are merged with each other and introduced into a resistor R204. Therefore, it is possible to increase output currents of the positive side and the negative side. It should be understood that the number of photo couplers are not limited to that as described above.

Figure 18:
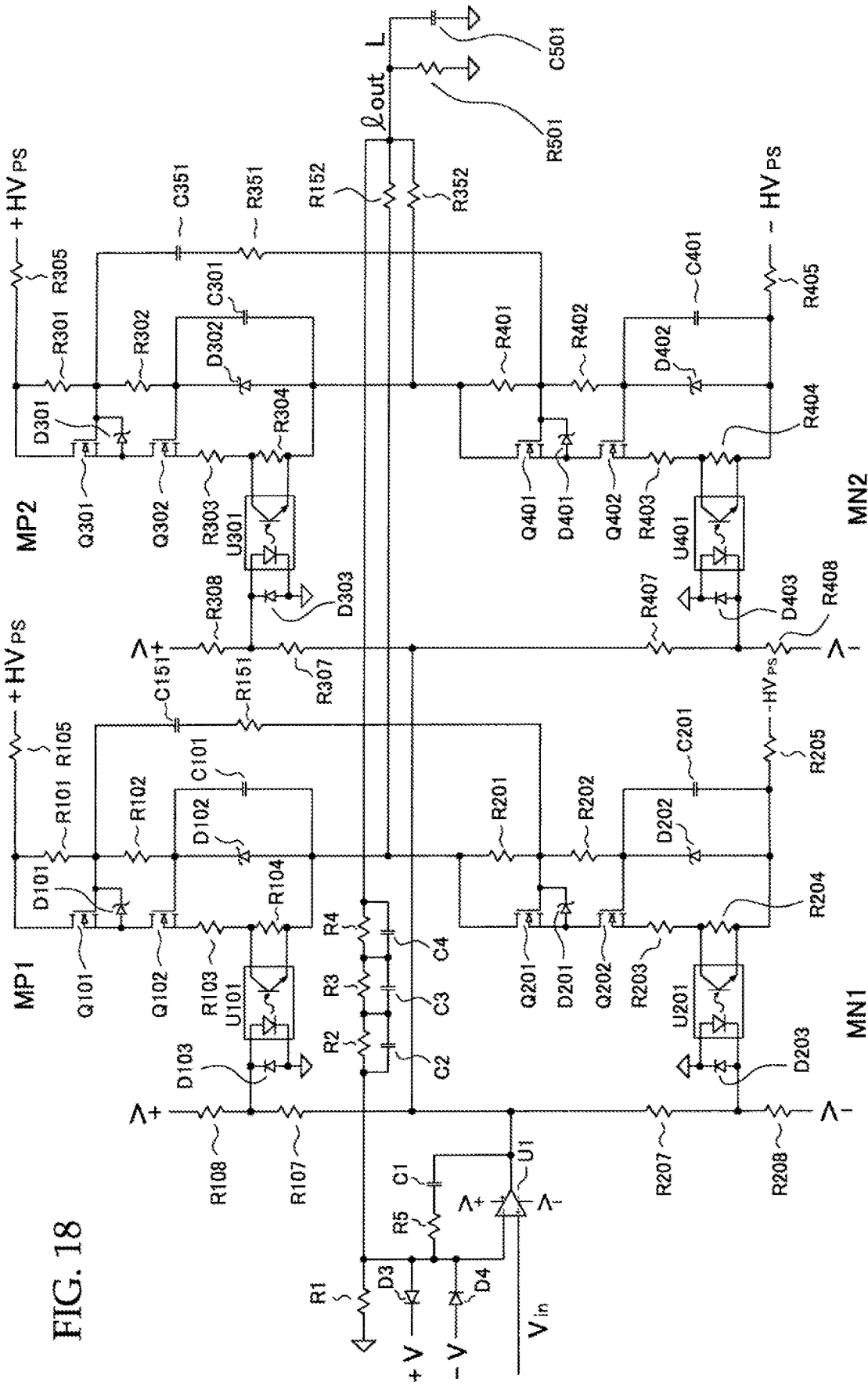
FIG. 18 is a drawing showing a circuit configuration example of the high-voltage output amplifier according to the present invention.

FIG. 18 is a drawing showing a modification of the high-voltage output amplifier according to the present invention. The circuit configuration of the high-voltage output amplifier shown in FIG. 18 differs from that of FIG. 2 in that positive and negative side are each provided with two amplifier circuits, each consisting of Nch MOS FETs of the output stage including a photo coupler as shown in FIG. 2. That is, in the positive side, an amplifier circuit MP1, consisting of a photo coupler U101, a Nch MOS FET Q101, and a Nch MOS FET Q102, and an amplifier circuit MP2, consisting of a photo coupler U301, a Nch MOS FET Q301, and a Nch MOS FET Q302, are arranged in parallel. In addition, in the negative side, an amplifier circuit MN1, consisting of a photo coupler U201, a Nch MOS FET Q201, and a Nch MOS FET Q202, and an amplifier circuit MN2, consisting of a photo coupler U401, a Nch MOS FET Q401, and a Nch MOS FET Q402, are arranged in parallel.

Output of an operational amplifier U1 in the input stage is inputted via a resistor R107 (for example 470Ω) and a resistor R307 (for example 470Ω) into light-emitting diodes as light-emitting parts of the photo couplers U101 and U301 and is also inputted via a resistor 8207 (for example 470Ω) and a resistor R407 (for example 470Ω) into light-emitting diodes as light-emitting parts of the photo couplers U201 and U401. Collector currents of the phototransistors as light-receiving parts of the photo couplers U101 and U301 are introduced into a resistor R104 and a resistor R304, respectively, to conduct current control at the sources of the Nch MOS FET Q102 of the amplifier circuit MP1 and of the Nch MOS FET Q302 of the amplifier circuit MP2 through a resistor R103 and a resistor 303, respectively. In a similar way, collector currents of the phototransistors as light-receiving parts of the photo couplers U201 and U401 control currents at the sources of the Nch MOS FET Q202 of the amplifier circuit MN1 and of the Nch MOS FET Q402 of the amplifier circuit MN2 through a resistor 8204 and a resistor R404, respectively.

Outputs of the amplifier circuit MP1 in the positive side and of the amplifier circuit MN1 in the negative side are supplied to a load L through an output line $l_{out}$ via simulator resistor R152. On the other hand, outputs of the amplifier circuit MP2 in the positive side and of the amplifier circuit MN2 in the negative side are supplied to a load L through an output line $l_{out}$ via simulator resistor R352. As mentioned above, since the high-voltage output amplifier is configured in such a manner that two high-voltage output amplifiers having similar circuit configuration as shown in FIG. 2 are arranged in each of the positive side and negative side, it is possible to increase the output current and also to make radiation treatment easier because the loss is diffused.

Therefore, it is possible to increase output currents in the positive side and the negative side. It should be understood that the numbers of circuits consisting of Nch MOS FETs of the output stages in the positive and negative sides are not limited to two and may be more than two. Accordingly, the loss can be further diffused, thus facilitating the radiation treatment.

Although some embodiments of the present invention have been described in the above, the present invention is not limited to the foregoing embodiments and can be modified in a variety of ways without departing from the scope of the claims and the technical idea indicated in the specification and the drawings.

EXPLANATION OF REFERENCES

C1, C2, C3, C4, C101, C151, C101, C201, C301, C351, C401, C501: condenser
D1, D2, D3, D4: diode
D101, D102, D103, D201, D202, D203, D301, D302, D303, D401, D402, D403: Zener diode
+HVps: high-voltage positive power source
−HVps: high-voltage negative power source
Q101, Q102, Q103, Q201, Q202, Q203, Q301, Q302, Q401, Q402: Nch MOS FET (negative channel metal oxide semiconductor field-effect transistor)
R1, R2, R3, R4, R5, R6, R7, R8, R9, R10, R11, R12, R13, R101, R102, R103, R104, R105, R106, R107, R108, R151, R152, R201, R202, 8203, R204, R205, R206, R207, 8208, R301, R302, R303, R304, R305, R306, R307, R308, R351, R352, R401, R402, R403, R404, R405, R407, R408,
R501: resistor
L: load
Lout: output line
U1: operational amplifier
U101, U102, U103, U201, U202, U203, U301, U401: photo coupler
+V: low-voltage positive power source
−V: low-voltage negative power source

What is claimed is:

1. A high-voltage output amplifier comprising an input stage circuit having a low-voltage amplifier, output stage circuits having high-voltage amplifiers, and photo couplers intervening between the input stage circuit and the output stage circuits, wherein an input signal is amplified by the low-voltage amplifier, the amplified signal is introduced into the high-voltage amplifiers through the photo couplers and is amplified, and the signal thus amplified is outputted from an output terminal of the high-voltage output amplifier, wherein the output stage circuits include a positive-side output stage circuit and a negative-side output stage circuit, and the photo couplers include a positive-side photo coupler and a negative-side photo coupler, wherein the high-voltage amplifier of each output stage circuit comprises Nch MOS FETs of N stages, and the source of the Nch MOS FET in one stage and the drain of the Nch MOS FET in the next stage are connected to each other in such a manner that the source of the Nch MOS FET in the first stage and the drain of the Nch MOS FET in the second stage are connected to each other, and the source of the Nch MOS FET of the N-th stage of the high-voltage amplifier in the positive-side output stage circuit is connected to the drain of the Nch MOS FET of the first stage of the high-voltage amplifier in the negative-side output stage circuit through a resistor, wherein a voltage of a predetermined positive high voltage value from a high-voltage positive power source is introduced into the drain of the Nch MOS FET of the first stage of the high-voltage amplifier in the positive-side output stage circuit while a gate voltage of a predetermined positive voltage value is applied to the gate of the Nch MOS FETs in the respective stages, wherein a voltage of a predetermined negative high voltage value from a high-voltage negative power source is introduced into the source of the Nch MOS FET of the N-th stage of the high-voltage amplifier in the negative-side output stage circuit while a gate voltage of a predetermined negative voltage value is applied to the gate of the Nch MOS FETs in the respective stages, and wherein the current control at the source of the Nch MOS FET of the N-th stage in the positive output stage circuit is conducted by the positive-side photo coupler and the current control at the source of the Nch MOS FET of the N-th stage in the negative output stage circuit is conducted by the negative-side photo coupler.

2. A high-voltage output amplifier as claimed in claim 1, wherein the gates of the respective Nch MOS FETs of the high-voltage amplifier in the positive-side output stage circuit are connected to the gates of the respective Nch MOS FETs of the high-voltage amplifier in the negative-side output stage circuit via condensers of predetermined capacitance value, respectively in such a manner that the gate of the Nch MOS FET of the first stage of the high-voltage amplifier in the positive-side output stage circuit is connected to the gate of the Nch MOS FET of the N−1-th stage of the high-voltage amplifier in the negative-side output stage circuit, the gate of the Nch MOS FET of the second stage of the high-voltage amplifier in the positive-side output stage circuit is connected to the gate of the Nch MOS FET of the N−2-th stage of the high-voltage amplifier in the negative-side output stage circuit . . . the gate of the Nch MOS FET of the N−1-th stage of the high-voltage amplifier in the positive-side output stage circuit is connected to the gate of the Nch MOS FET of the first stage of the high-voltage amplifier in the negative-side output stage circuit.

3. A high-voltage output amplifier as claimed in claim 2, wherein a resistor is connected in series to each condenser connecting the gate of the Nch MOS FET of the high-voltage amplifier in the positive-side output stage circuit to the gate of the Nch MOS FET of the high-voltage amplifier in the negative-side output stage circuit.

4. A high-voltage output amplifier comprising an input stage circuit having a low-voltage amplifier, output stage circuits having high-voltage amplifiers, and photo couplers intervening between the input stage circuit and the output stage circuits, wherein an input signal is amplified by the low-voltage amplifier, the amplified signal is introduced into the high-voltage amplifiers through the photo couplers and is amplified, and the signal thus amplified is outputted from an output terminal of the high-voltage output amplifier, wherein the output stage circuits include one or more positive-side output stage circuits disposed in the positive side and one or more negative-side output stage circuits in the negative side, each high-voltage amplifier in the positive-side output stage circuit and in the negative-side output stage circuit comprises at least first and second Nch MOS FETs, wherein the source of the first Nch MOS FET is connected to the drain of the second Nch MOS FET, the source of the second Nch MOS FET of the high-voltage amplifier in the positive-side output stage circuit is connected via a resistor to the drain of the first Nch MOS FET of the high-voltage amplifier in the negative-side output stage circuit, a voltage of a predetermined positive high voltage value from a high-voltage power source is introduced into the drain of the first Nch MOS FET of the high-voltage amplifier in the positive-side output stage circuit while a bias voltage of a predetermined positive voltage value is applied to the respective gates of the first Nch MOS FET and the second Nch MOS FET, and a voltage of a predetermined negative high voltage value from a high-voltage power source is introduced into the source of the second Nch MOS FET of the high-voltage amplifier in the negative-side output stage circuit while a bias voltage of a predetermined negative voltage value is applied to the respective gates of the first Nch MOS FET and the second Nch MOS FET, and wherein the current control at the source of the second Nch MOS FET of the high-voltage amplifier in the positive output stage circuit is conducted by the positive-side photo coupler, and the current control at the source of the second Nch MOS FET in the negative output stage circuit is conducted by the negative-side photo coupler.

5. A high-voltage output amplifier as claimed in claim 4, wherein the gate of the first Nch MOS FET of the high-voltage amplifier in the positive-side output stage circuit and the gate of the first Nch MOS FET of the high-voltage amplifier in the negative-side output stage circuit are connected to each other through a condenser having at least a predetermined capacitance value.

6. A high-voltage output amplifier as claimed in claim 5, wherein a resistor is connected in series to the condenser connected between the gate of the first Nch MOS FET in the positive-side output stage circuit and the gate of the first Nch MOS FET in the negative-side output stage circuit.

* * * * *